US009722391B2

(12) United States Patent
Han et al.

(10) Patent No.: US 9,722,391 B2
(45) Date of Patent: Aug. 1, 2017

(54) LASER SYSTEM

(75) Inventors: Young Geun Han, Seoul (KR); Ryun Kyung Kim, Seoul (KR); Sang Oh Park, Seoul (KR); Oh Jang Kwon, Seoul (KR); Su Ho Chu, Seoul (KR)

(73) Assignee: IUCF-HYU (INDUSTRY-UNIVERSITY COOPERATION FOUNDATION HANYANG UNIVERSITY), Seoul (KR)

( * ) Notice: Subject to any disclaimer, the term of this patent is extended or adjusted under 35 U.S.C. 154(b) by 1275 days.

(21) Appl. No.: 13/701,703

(22) PCT Filed: Jun. 1, 2011

(86) PCT No.: PCT/KR2011/003993
§ 371 (c)(1),
(2), (4) Date: Feb. 11, 2013

(87) PCT Pub. No.: WO2011/152654
PCT Pub. Date: Dec. 8, 2011

(65) Prior Publication Data
US 2016/0315440 A1    Oct. 27, 2016

(30) Foreign Application Priority Data

Jun. 4, 2010  (KR) ......................... 10-2010-0052722
Jul. 30, 2010  (KR) ......................... 10-2010-0074286
Dec. 16, 2010  (KR) ......................... 10-2010-0129124

(51) Int. Cl.
*H01S 3/30*  (2006.01)
*H01S 3/067*  (2006.01)
(Continued)

(52) U.S. Cl.
CPC ........ *H01S 3/06791* (2013.01); *H01S 3/0941* (2013.01); *H01S 3/094015* (2013.01);
(Continued)

(58) Field of Classification Search
CPC .......... H01S 3/06791; H01S 3/094015; H01S 3/094019; H01S 3/094065; H01S 3/094042; H01S 3/0941
See application file for complete search history.

(56) References Cited

U.S. PATENT DOCUMENTS 5,153,933 A * 10/1992 Smith ................... H01S 3/0057
                                                        385/27
5,841,797 A * 11/1998 Ventrudo ........... G02B 6/02076
                                                        250/225

(Continued)

FOREIGN PATENT DOCUMENTS

KR           100225282 B1      10/1999
KR      10-1999-0081342       11/1999
(Continued)

OTHER PUBLICATIONS

International Search report mailed Feb. 6, 2012 in PCT/KR2011/003993 with English-language translation (5 pgs.).

*Primary Examiner* — Yuanda Zhang
(74) *Attorney, Agent, or Firm* — Gilberto M. Villacorta; Jihwang Yeo; Foley & Lardner LLP

(57) ABSTRACT

A laser system according to an embodiment of the present invention includes an oscillation unit to generate a laser output, a connection unit to connect the oscillation unit with an optical fiber loop, an amplifying unit to amplify the laser output on the optical fiber loop, a conversion unit disposed on the optical fiber loop to convert pulsed wave laser output into continuous wave laser output, and an output unit disposed between the connection unit and the conversion unit to split a part of the laser output toward the conversion unit. The system for generating a high output pulsed wave laser and converting the pulsed wave laser into a continuous wave laser may be implemented in a simple structure and small size with high stability and high reproducibility. In
(Continued)

addition, a high output laser may be obtained. Also, since conversion from the pulsed wave into the continuous wave is easy, both of the high output pulsed wave and the high output continuous wave may be obtained as necessary.

16 Claims, 19 Drawing Sheets

(51) Int. Cl.
*H01S 3/094* (2006.01)
*H01S 3/0941* (2006.01)
*H01S 3/08* (2006.01)

(52) U.S. Cl.
CPC .. *H01S 3/094019* (2013.01); *H01S 3/094042* (2013.01); *H01S 3/094065* (2013.01); *H01S 3/0809* (2013.01)

(56) References Cited

U.S. PATENT DOCUMENTS

| | | | | |
|---|---|---|---|---|
| 5,900,968 A * | 5/1999 | Srivastava | ......... | H04B 10/2912 359/341.41 |
| 6,356,385 B1 * | 3/2002 | Digonnet | .............. | H01S 3/1302 359/337 |
| 7,830,926 B1 * | 11/2010 | Kim | ....................... | B82Y 20/00 372/20 |
| 2005/0281298 A1 * | 12/2005 | Kupershmidt | .......... | H01S 5/141 372/34 |
| 2006/0120417 A1 * | 6/2006 | Wang | ........................ | H01S 5/50 372/30 |
| 2006/0187537 A1 * | 8/2006 | Huber | ..................... | H01S 3/106 359/337.22 |
| 2007/0160091 A1 * | 7/2007 | Lee | ......................... | H01S 3/067 372/6 |
| 2011/0155916 A1 * | 6/2011 | Furusawa | ........... | H01S 3/06791 250/363.04 |

FOREIGN PATENT DOCUMENTS

| | | |
|---|---|---|
| KR | 20000032475 A | 6/2000 |
| KR | 10-2002-0014173 | 2/2002 |
| KR | 20020077061 A | 10/2002 |
| KR | 20020085332 | 11/2002 |
| KR | 10-2004-0089772 | 10/2004 |
| KR | 10-0475579 | 3/2005 |

* cited by examiner

FIG. 15
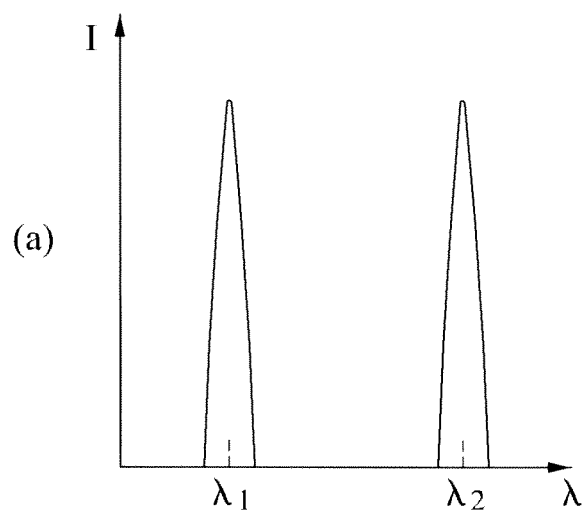
(a)
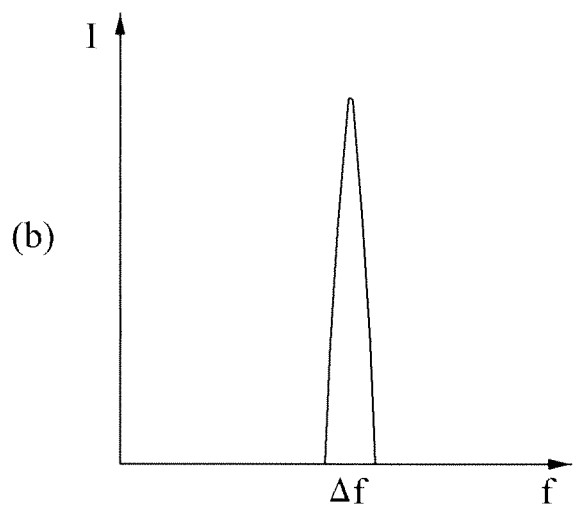
(b)

LASER SYSTEM

TECHNICAL FIELD

The present invention relates to a laser system, and more particularly, to a laser system capable of amplifying a low output pulsed wave laser into a high output pulsed wave laser and converting the high output pulsed wave laser into a high output continuous wave laser.

BACKGROUND ART

An optical laser technology is applied to various fields related to a medical biopsy and detection technology, an optical sensor technology, an optical communication technology, and further to a military weapon technology, a microwave wireless communication technology, an industrial marking and cutting technology, and the like.

In particular, a high output pulsed wave laser is widely used in marking, material processing, remote sensing, Fluorescence Spectroscopy, and the like. A high output continuous wave laser is widely used in communication systems, Fluorescence Spectroscopy, imaging including optical coherence tomography (OCT), and the like.

Generally, a laser system for generating the high output pulsed wave or the continuous wave laser uses semiconductor laser of a single longitudinal mode. In particular, a semiconductor diode laser having an external resonator structure satisfies both of convenient wavelength change and narrow linewidth. However, since output of a laser beam is limited to several to tens of mW, a master oscillator power amplifier (MOPA) laser system may be used to obtain a single longitudinal mode laser beam having an output of about hundreds of mW. Here, the MOPA laser system uses the diode laser of the external resonator structure as a master oscillator (MO) and uses a tapered semiconductor gain medium as a power amplifier (PA).

FIG. 1 illustrates a configuration of a conventional high output pulsed wave laser system, which uses a gain switched distributed feedback (DFB) laser diode as a MO and uses a semiconductor light amplifier including InGaAs/GaAsP with a tapered portion of about 3 mm as a PA, thereby obtaining a high output pulsed wave laser beam. The DFB laser diode 11 generates pulses of picosecond. A laser beam emitted by the MO may be collimated by a lens 12, passed through an optical isolator 13, and focused by the lens 12 to a ridge-waveguide portion 14 of the PA. Also, as the laser beam passes through a tapered wave guide 15 of the PA, the output is increased and collected through the lens 12. Accordingly, output characteristic of the laser beam may be understood.

However, such a conventional high output pulsed wave laser system requires expensive equipment and a complicated process for semiconductor processing. Since the system is a bulk type that combines laser beams using a plurality of lenses, combination efficiency may be unsatisfactory. Furthermore, in a linear laser system, the laser beam passes through a PA part of a MO. Therefore, amplification efficiency of the laser beam may not be high.

DISCLOSURE OF INVENTION

Technical Goals

An aspect of the present invention provides a laser system capable of achieving high output with high stability and high reproducibility, by increasing coupling efficiency between an oscillator and an amplifier using an optical fiber.

Another aspect of the present invention provides a laser system capable of obtaining high output with only one amplifier by constructing a loop-type fiber resonator.

Another aspect of the present invention provides a laser system implemented in a small size and a simple structure.

Another aspect of the present invention provides a laser system capable of obtaining a high output pulsed wave and a high output continuous wave as necessary, by converting a pulsed wave into a continuous wave.

Another aspect of the present invention provides a laser system capable of obtaining a laser output at a particular wavelength or simultaneously at several wavelengths, by constructing a fiber amplifier using various rare earth based elements.

Another aspect of the present invention provides a laser system capable of generating electromagnetic waves, especially, terahertz waves.

Another aspect of the present invention provides a laser system including optical fiber, capable of achieving a laser output with high stability and high coupling efficiency.

Another aspect of the present invention provides a laser system capable of controlling a gap between two wavelengths easily and accurately.

Another aspect of the present invention provides a laser system capable of obtaining a high output laser beam by employing a fiber gain medium.

Another aspect of the present invention provides a laser system capable of obtaining a stable laser output by achieving high mode matching between a plurality of longitudinal modes generated from a laser diode with a variable optical filter one by one.

Another aspect of the present invention provides a laser system capable of obtaining a laser output having one longitudinal mode by a longitudinal mode of a laser diode with a small linewidth.

Another aspect of the present invention provides a laser system capable of obtaining a high laser output power by an additional gain of a laser diode.

Technical Solutions

According to an aspect of the present invention, there is provided a laser system including an oscillation unit to generate a laser output, a connection unit to connect the oscillation unit with an optical fiber loop, and an amplifying unit to amplify the laser output on the optical fiber loop, wherein the laser output is repeatedly amplified by the amplifying unit while circulating the optical fiber loop.

The laser system may further include a conversion unit disposed on the optical fiber loop to convert pulsed wave laser output into continuous wave laser output.

The laser system may further include an output unit disposed between the connection unit and the conversion unit to split a part of the laser output toward the conversion unit.

The oscillation unit may be gain-switched to output a pulsed wave. The semiconductor laser diode may be a distributed feedback semiconductor laser diode of a single longitudinal mode. The semiconductor laser diode may be a Fabry-Pérot (FP) semiconductor laser diode of a single longitudinal mode, and the FP semiconductor laser diode may implement laser of an external resonator structure by an optical fiber grating having a narrow linewidth for a laser output of a single longitudinal mode.

The connection unit may be an optical circulator controlling the laser output from the oscillation unit to advance sequentially to a first port, a second port, and a third port. The oscillation unit may be connected to the first port, the amplifying unit may be connected to the second port, and the third port may be connected to the output unit.

The amplifying unit may include a pump laser diode to provide a pumping light having a different wavelength from the output laser, an gain fiber to amplify the laser output, and a wavelength division multiplexing (WDM) coupler to connect the connection unit, the gain fiber, and the pump laser diode.

The gain fiber may include rare earth based elements, the rare earth based elements may emit a laser light having a same wavelength band as a wavelength of the laser output, and the laser output may be amplified by population inversion of atoms generated by the pumping light.

The laser system may further include an optical isolator disposed on the optical fiber loop to control the laser output to progress in one direction.

The output unit may be a connection unit to split a part of the laser output, the connection unit may split the laser output at a ratio of 90:10 to 50:50, and a ratio of an input port and an output port may be 1:2 or 2:2.

The conversion unit may include dispersion fiber having a high dispersion value.

The dispersion fiber may generate pulse dispersion of continuous wave laser output, and may be connected to one end of the output unit to determine a dispersion amount according to a pulse repetition rate and an entire wavelength band.

According to an aspect of the present invention, there is provided a laser system including an oscillation unit to generate a plurality of wavelengths for generation of electromagnetic waves, a connection unit to connect the oscillation unit and an optical fiber loop, and an amplifying unit to amplify an optical signal on the optical fiber loop, wherein the optical signal is repeatedly amplified by the amplifying unit while circulating the optical fiber loop.

The laser system may mix optical signals having two oscillation wavelengths from the oscillation unit with a photoconductive material, determine a beat frequency according to the two oscillation wavelengths and a wavelength spacing by a following equation, and generate terahertz waves corresponding to the beat frequency:

$$\Delta f = \frac{c(\lambda_2 - \lambda_1)}{\lambda_1 \lambda_2} = \frac{c\Delta\lambda}{\lambda_2(\lambda_2 - \Delta\lambda)} = \frac{c\Delta\lambda}{\lambda_1(\lambda_1 + \Delta\lambda)}$$

wherein, $\lambda_1$ and $\lambda_2$ denote the two oscillation wavelengths and $\Delta\lambda$ denotes the wavelength spacing.

The oscillation unit may include two optic fiber Bragg gratings having different oscillation wavelengths or a sampled grating having two oscillation wavelengths.

The oscillation unit may include two semiconductor diodes having different oscillation wavelengths.

The laser system may further include a saturable absorber unit disposed between the oscillation unit and the connection unit to control a reflected wavelength of the oscillation unit to form a narrow linewidth and one oscillation wavelength in a stable mode.

The laser system may further include an output unit disposed on the optical fiber loop to split a part of the optical signal The laser system may further include an optical isolator disposed on the optical fiber loop to control the output optical signal to progress in one direction.

The amplifying unit may be an optical amplifier to which a semiconductor optical amplifier, a Raman optical amplifier, or rare earth based elements are added.

The laser system may further include a gain equalization unit disposed on the optical fiber loop to equalize gains of a plurality of optical signals and accordingly equalize powers of the optical signals.

The oscillation unit may include an oscillation wavelength spacing control member to control an interval between two oscillation wavelengths.

The oscillation wavelength spacing control member may be a strain control member.

The strain control member may apply tension or compression force to the oscillation unit to control a wavelength spacing by moving a wavelength toward a long wavelength by applying the tension and moving a wavelength toward a short wavelength by applying the compression force.

The oscillation wavelength spacing control member may be a heater adapted to vary a temperature of the oscillation unit, the heater adapted to control the wavelength spacing by heating the oscillation unit so that the wavelength is shifted to a long wavelength or a short wavelength.

The oscillation wavelength control member may be a current or voltage control member adapted to control the wavelength spacing by controlling a current or a voltage so that the wavelength is shifted to a long wavelength or a short wavelength.

According to an aspect of the present invention, there is provided a laser system including an optical fiber loop configured in a loop type to include optical fiber for forming a path for a beam, an oscillation unit configured in a laser diode type including a plurality of longitudinal modes and provided at one side port of the connection unit mounted to the path of the optical path to receive the beam to the optical fiber loop through the connection unit, and a wavelength tunable optical filter mounted on the path of the optical fiber to filter a beam generated from the oscillation unit and passed through the connection unit by tuning the beam to a predetermined wavelength region.

The laser system may further include an amplifying unit mounted on the path of the optical fiber to amplify or oscillate the beam, an output unit mounted on the path of the optical fiber to output a part of the beam passed through the wavelength tunable optical filter, and at least one optical isolator mounted on the path of the optical fiber to control the beam to progress in one direction.

The oscillation unit may be an FP laser diode.

Both surfaces of the oscillation unit may be coated with a high-reflection material or one surface for output of the both surfaces may be coated with an anti-reflection material.

The wavelength tunable optical filter may be a fiber FP type configured to continuously vary a wavelength by controlling an internal pore distance.

The connection unit sequentially may output the beam provided from the FP laser diode.

The amplifying unit may be any one selected from a semiconductor optical amplifier (SOA), a fiber amplifier including rare earth based elements, and a Raman amplifier.

A gain band of the amplifying unit may correspond to a wavelength band of the oscillation unit.

The connection unit and the optical isolator may correspond to the wavelength band of the oscillation unit.

The output unit may output a part of the beam according to a predetermined ratio, the output unit of which a ratio of an input port and an output port is set to 1:2 or 2:2.

The laser system may further include a fiber delay line mounted on the path of the optical fiber to generate wavelength tuning of the beam at a high speed at the wavelength tunable optical filter.

The fiber delay line may include a general optical fiber provided as the optical fiber loop and a dispersion optical fiber that controls dispersion of the optical fiber loop.

A circulation time of the optical fiber loop may be a multiple of a tuning period of the wavelength tunable optical filter.

According to an aspect of the present invention, there is provided a laser system including an optical fiber, an oscillation unit mounted to one end of the optical fiber, being an FP laser diode configured to generate a plurality of longitudinal modes as a light source, and a wavelength tunable optical filter mounted to the optical fiber to filter a beam received from the oscillation unit through the optical fiber by tuning the beam to a predetermined wavelength region, wherein the plurality of longitudinal modes oscillated and output by the oscillation unit and a window of the wavelength tunable optical filter are matched so that one longitudinal mode is output.

The wavelength tunable optical filter may include a piezoelectric material, and the laser system varies a voltage applied to the piezoelectric material, thereby varying a pore distance provided to the wavelength tunable optical filter, and performs filtering when a window having a constant linewidth of the wavelength tunable optical filter selected as an interference is moved in the wavelength region.

Effects

According to an embodiment of the present invention, high output with high stability and high reproducibility may be obtained since high coupling efficiency between an oscillator and an amplifier is secured using an optical fiber.

According to an embodiment of the present invention, high output may be achieved with only one amplifier by constructing a loop-type fiber resonator.

According to an embodiment of the present invention, a laser system may be implemented in a small size and a simple structure by employing optical fiber.

According to an embodiment of the present invention, a pulsed wave may be converted into a continuous wave with ease and a high output pulsed wave and a high output continuous wave may be obtained as necessary.

According to an embodiment of the present invention, a laser output may be achieved at a particular wavelength or simultaneously at several wavelengths, by constructing a fiber amplifier using a variety of rare earth based elements.

According to an embodiment of the present invention, a laser system may include optical fiber with a small size and a simple structure, and may generate tunable terahertz waves.

According to an embodiment of the present invention, a laser output with high stability and high coupling efficiency may be achieved by a laser system including optical fiber.

According to an embodiment of the present invention, a gap between two wavelengths may be controlled easily and accurately and therefore tuning of terahertz waves may be facilitated.

According to an embodiment of the present invention, since terahertz frequency is generated by mixing of photoconductive materials, a high signal to noise ratio (SNR) and spectrum resolution required in a terahertz time domain spectroscopy system may be achieved. In addition, since a monochromatic light frequency band is selected with respect to a particular absorption line of a sample to be analyzed, data collection may be performed by a scanning distance and resolution of the selected frequency, at a low cost.

According to an embodiment of the present invention, high mode matching between a plurality of longitudinal modes generated from a laser diode with a variable optical filter one by one may be performed, thereby achieving a stable laser output.

According to an embodiment of the present invention, a laser output having one longitudinal mode may be obtained by a longitudinal mode of a laser diode with a small linewidth.

According to an embodiment of the present invention, a high laser output power may be obtained by an additional gain of a laser diode.

BRIEF DESCRIPTION OF DRAWINGS

FIG. 15 is a diagram illustrating an output spectrum of a two-wavelength output fiber laser system for generation of electromagnetic waves;

BEST MODE FOR CARRYING OUT THE INVENTION

Figure 1:
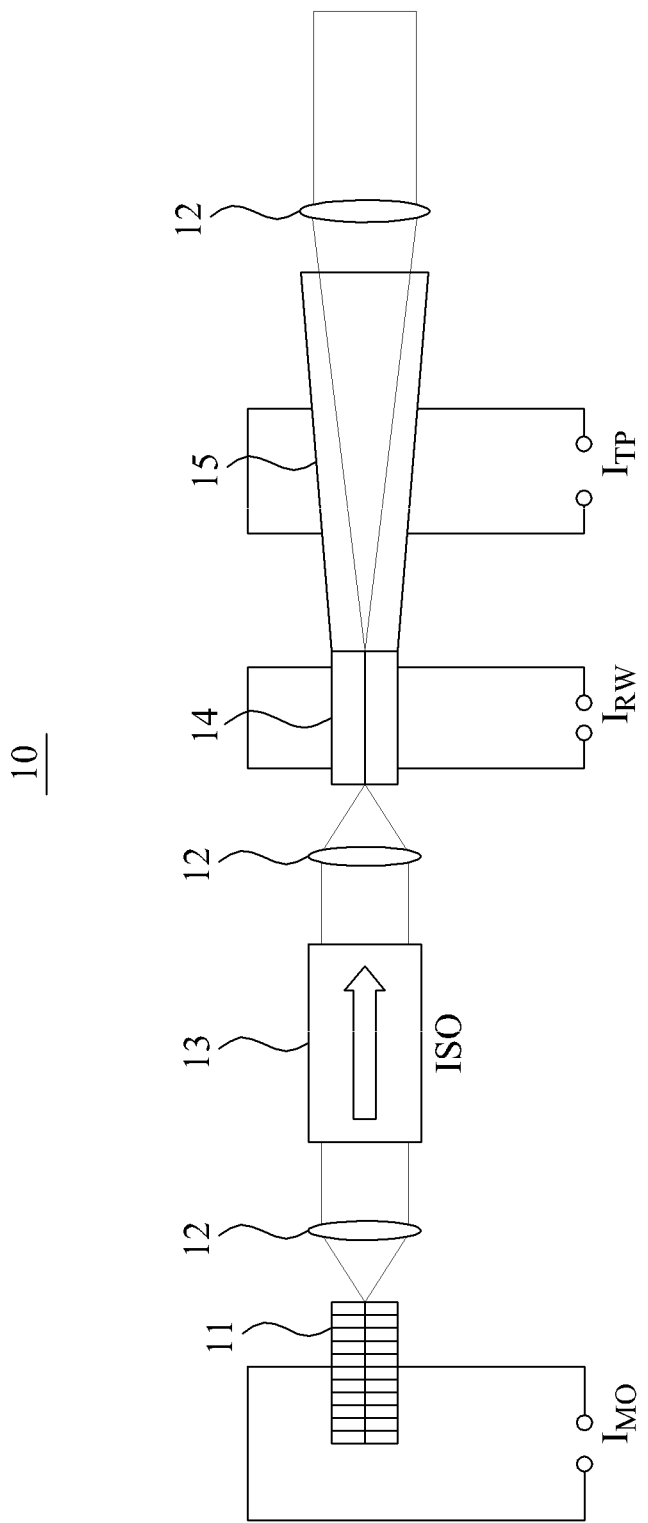
FIG. 1 is a diagram illustrating a configuration of a high output pulsed wave laser system according to a conventional art.

Reference will now be made in detail to embodiments of the present invention, examples of which are illustrated in the accompanying drawings, wherein like reference numerals refer to the like elements throughout.

The following description illustrates one of various aspects of the present invention and constitutes part of a detailed description about the present invention.

Figure 2:
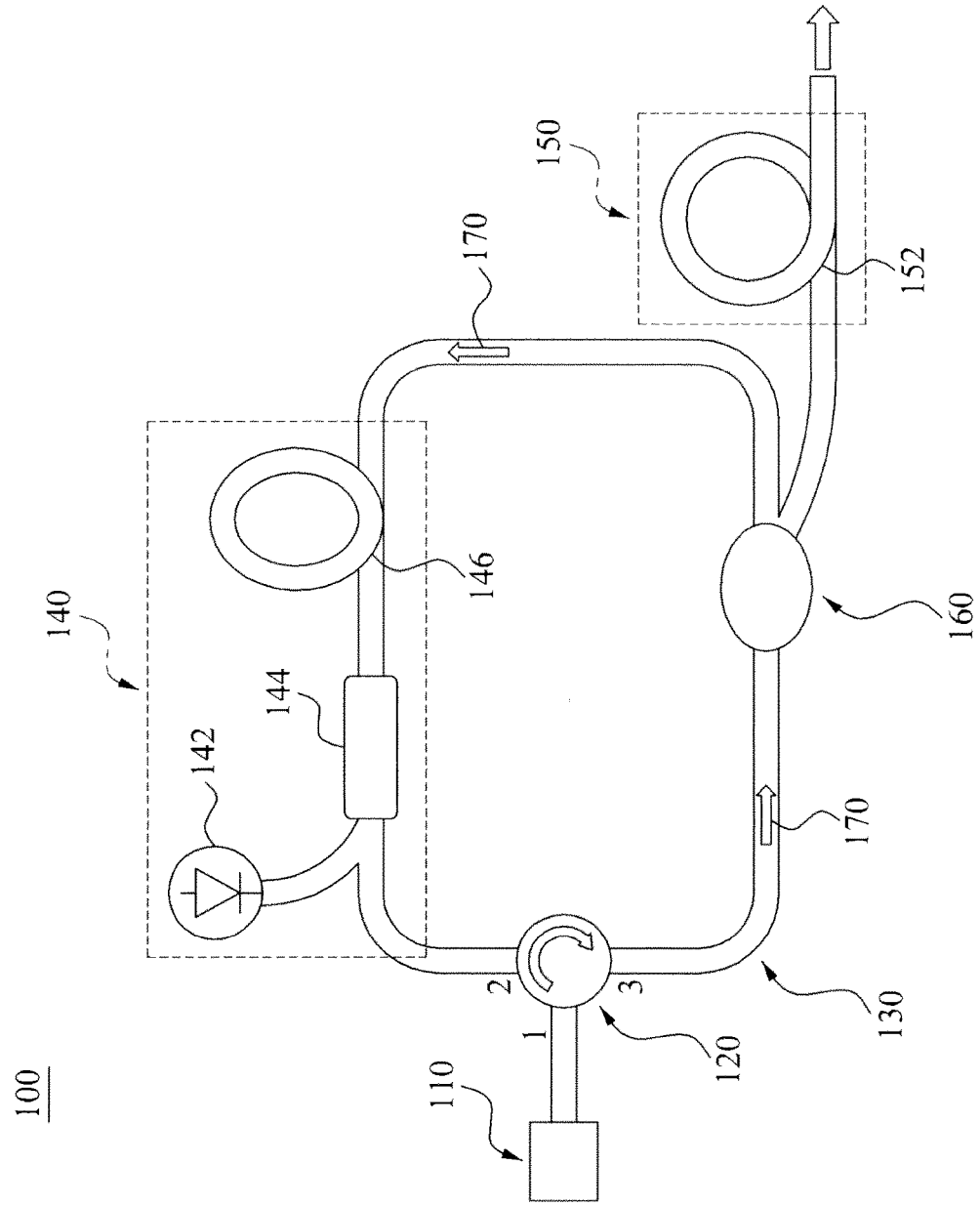
FIG. 2 is a diagram illustrating a configuration of a system for generating a high output pulsed wave laser and converting the pulsed wave laser into a continuous wave laser, according to a first embodiment of the present invention.
Figure 3:
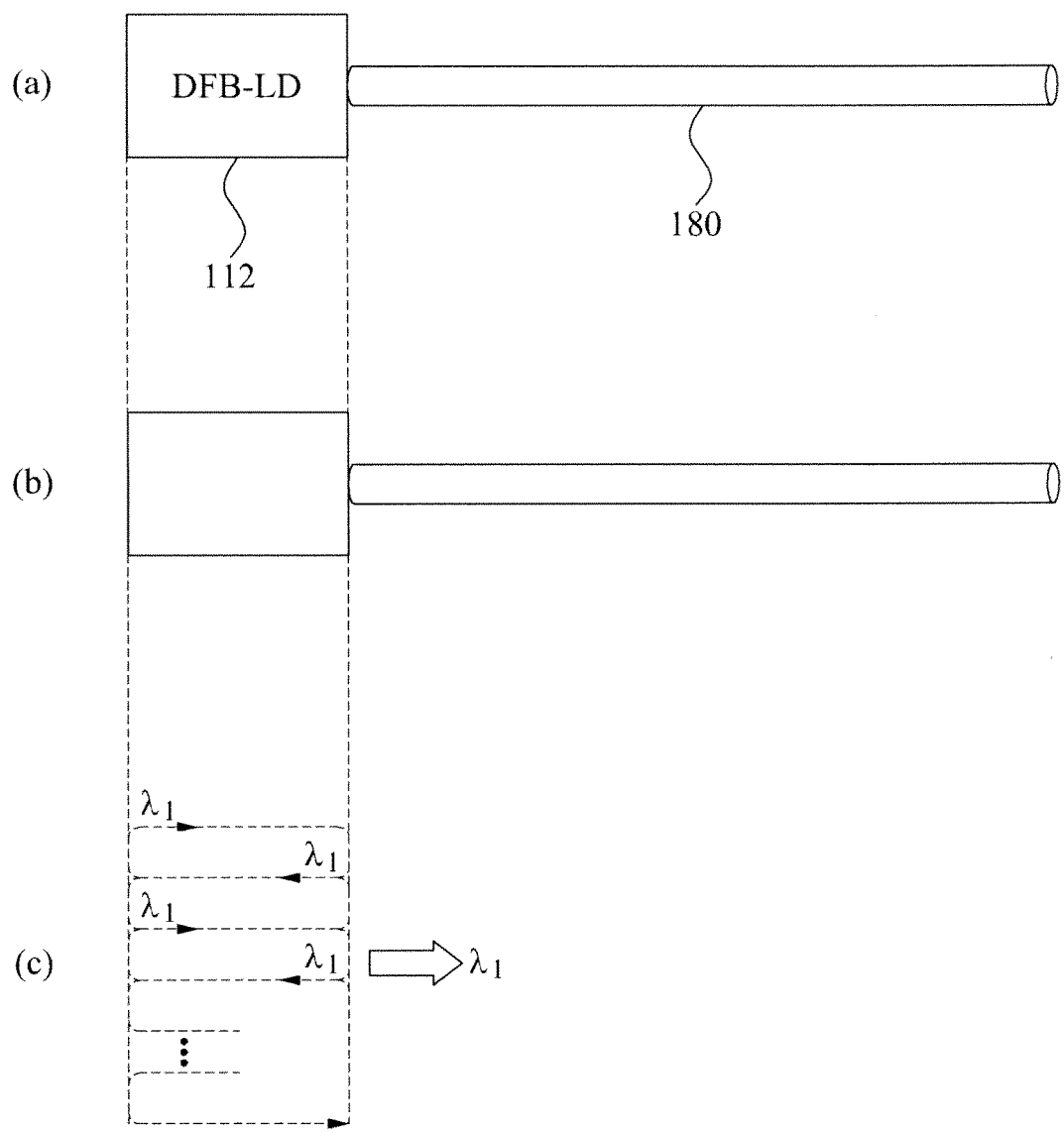
FIG. 3 is a plan view, a sectional view, and an operational view of a semiconductor laser diode having a single longitudinal mode according to an embodiment of the present invention.
Figure 4:
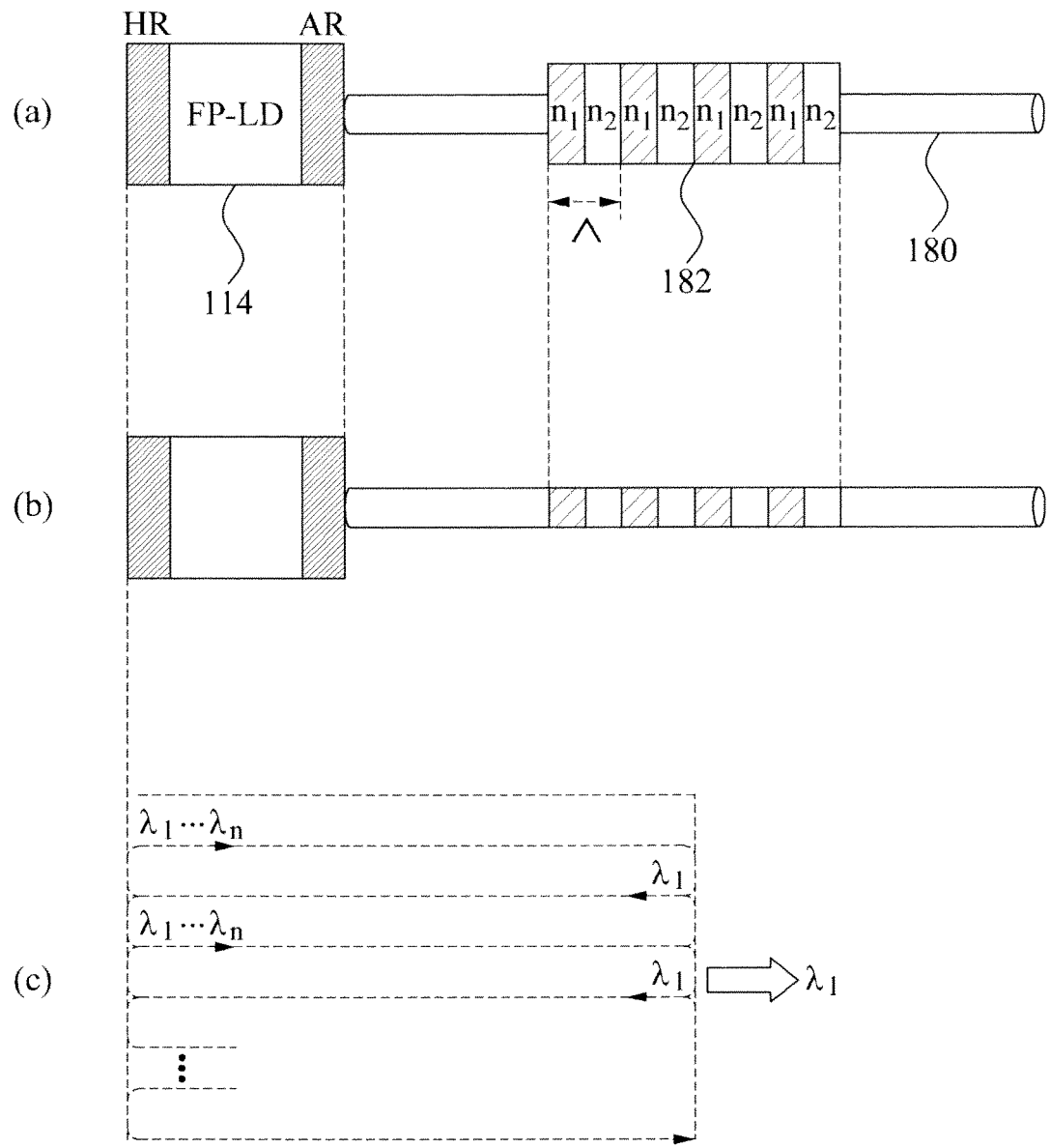
FIG. 4 is a plan view, a sectional view, and an operational view of a semiconductor laser diode having a single longitudinal mode according to another embodiment of the present invention.
Figure 5:
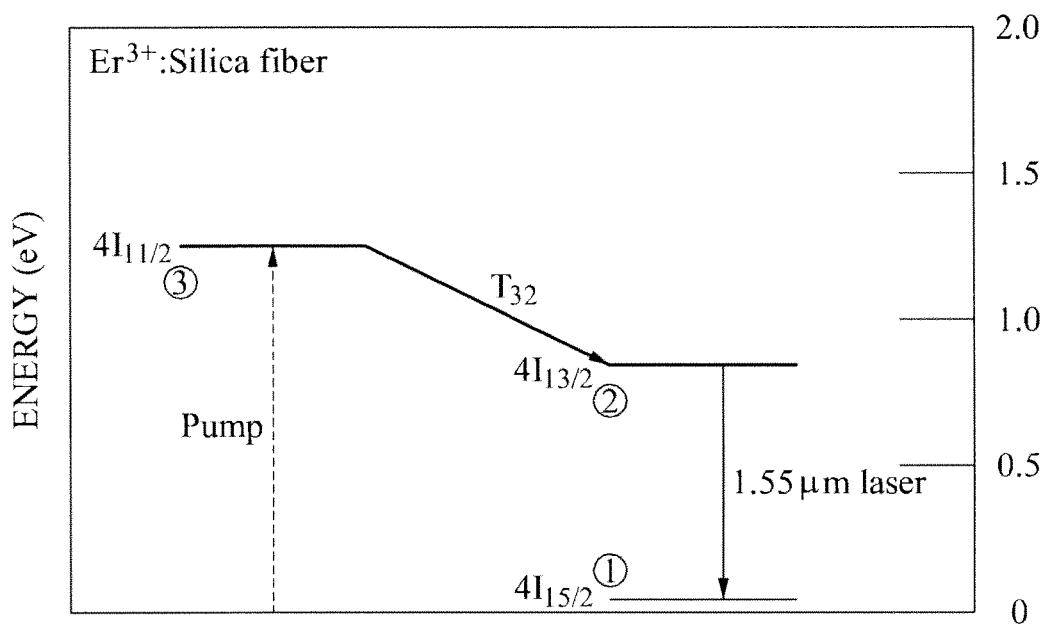
FIG. 5 is a graph illustrating an operational mechanism of an amplifying unit.
Figure 6:
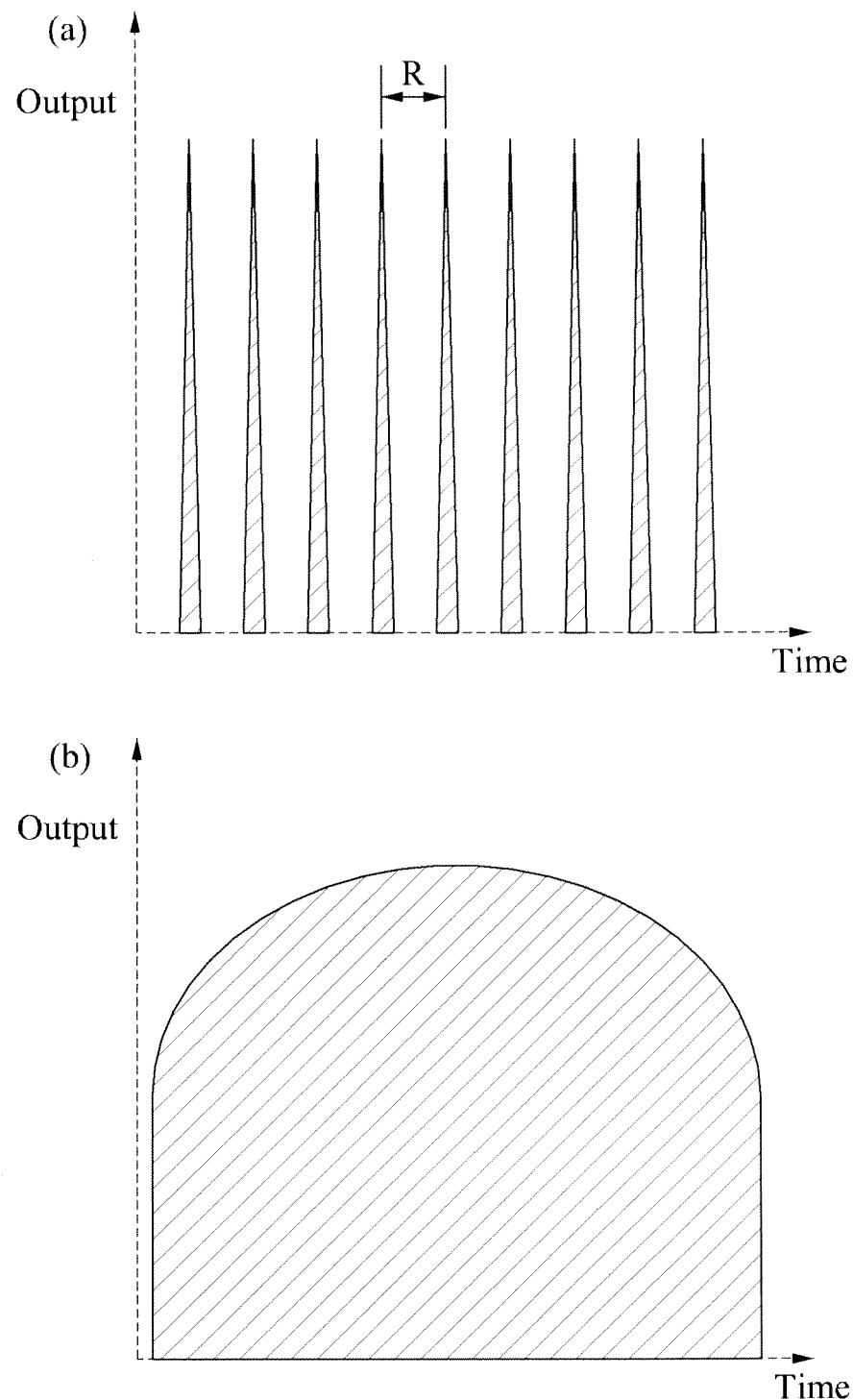
FIG. 6 is a graph illustrating amplitudes of a pulsed wave laser and of a continuous wave laser according to time, according to an embodiment of the present invention.

FIG. 2 is a diagram illustrating a configuration of a system 100 for generating a high output pulsed wave laser and converting the pulsed wave laser into a continuous wave laser, according to an embodiment of the present invention. FIG. 3 illustrates an example of a semiconductor laser diode having a single longitudinal mode as an oscillation unit. FIG. 4 illustrates another example of a semiconductor laser diode having a single longitudinal mode as an oscillation unit. FIG. 5 is a graph illustrating an operational mechanism of an amplifying unit. FIG. 6 is a graph illustrating amplitudes of a pulsed wave laser and of a continuous wave laser according to time, according to an embodiment of the present invention.

Referring to FIG. 2, a laser system according to the first embodiment of the present invention, that is, the system 100 for generating a high output pulsed wave laser and converting the pulsed wave laser into a continuous wave laser may include an oscillation unit 110 to generate a laser output, a connection unit 120 connecting the oscillation unit 110 with an optical fiber loop 130, an amplifying unit 140 to amplify a laser output on the optical fiber loop 130, a conversion unit 150 mounted on the optical fiber loop 130 to convert a pulsed wave laser output into a continuous wave laser output, and an output unit 160 disposed between the connection unit 120 and the conversion unit 150 to split a part of the laser output toward the conversion unit 150.

The laser generation and conversion system 100 may be in a loop structure divided into a part for generating the high output pulsed wave laser and a part for converting the pulsed wave laser into the continuous wave laser output beam. The oscillation unit 110, the connection unit 120, the optical fiber loop 130, the amplifying unit 140, and the output unit 160 may generate the high output pulsed wave laser. The conversion unit 150 may convert the pulsed wave laser into the continuous wave laser.

Referring to FIG. 3, the oscillation unit 110 may be a semiconductor laser diode having a single longitudinal mode. FIG. 3(a) is a plan view, FIG. 3(b) is a front view, and FIG. 3(c) is an operational view.

The semiconductor laser diode having the single longitudinal mode may generate a seed laser of a master oscillator (MO) in the laser generation and conversion system 100. The semiconductor laser diode may include a distributed feedback (DFB) laser diode 112 and an optical fiber 180 connected with each other. In the DFB semiconductor laser diode 112, a laser light having one wavelength $\lambda_1$ is output from a resonator and advances along an optical fiber core. The output beam of the DFB semiconductor laser diode 112 may be connected to a core layer to be favorably incident to the core layer having a higher refractive index so that light advances in the optical fiber.

Referring to FIG. 4, the oscillation unit 110 may be a semiconductor laser diode of a plurality of longitudinal modes. FIG. 4(a) is a plan view, 4(b) is a front view, and FIG. 4(c) is an operational view.

The semiconductor laser diode having the plurality of longitudinal modes may be a Fabry-Pérot (FP) semiconductor laser diode 114. The semiconductor laser diode may be connected with the optical fiber 180. A fiber Bragg grating 182 may be formed at a part of the optical fiber 180. The grating 182 may include a reflection mirror for an external resonator, so that the seed laser of the MO has only one wavelength. It is preferred that a reflection rate of the reflection mirror is not 100%.

The grating 182 may be in a short period type having a period $\Lambda$ including a plurality of periodical layers of which a refractive indexes $n_1$ and $n_2$. The grating 182 has a reflection peak corresponding to the period. The grating 182 may be manufactured by arranging a phase mask on the optical fiber 180 and emitting ultraviolet (UV) rays so that a grating is generated in the optical fiber. In the grating 182, the oscillation wavelength $\lambda$ according to the period may be determined by the period $\Lambda$ of the grating 182 and an effective refractive index $n_{eff}$ of the optical fiber core, as follows.

$$\lambda = 2n_{eff}\Lambda$$

Therefore, the fiber Bragg grating 182 may be configured such that a wavelength $\lambda 1$ is reflected according to the period $\Lambda$ and the effective refractive index $n_{eff}$. The grating 182 may be formed in the core layer of the optical fiber 180. Since one side of the FP semiconductor laser diode 114 is high reflection (HR) coated while another side is anti reflection (AR) coated, a resonator of the FP semiconductor laser diode 114 is not provided but the FP semiconductor laser diode 114 may be implemented as a resonator together with the grating 182 for an external resonator having the reflection peak, instead. The laser output beam having a plurality of wavelengths from $\lambda_1$ to $\lambda_n$ emitted from the FP semiconductor laser diode 114 may advance along the core layer of the optical fiber and part $\lambda 1$ of the wavelengths may be reflected and returned to the FB semiconductor laser diode 114. Accordingly, resonation occurs at the wavelength $\lambda 1$ between the semiconductor laser diode 114 and grating 1182. Since the reflection rate of the grating 182 is not 100%, a laser output beam having an oscillation wavelength $\lambda 1$ is output to an output end of the external resonator.

Referring to FIG. 2 again, when the oscillation unit 110, which is the semiconductor laser diode having the single longitudinal mode, outputs a pulsed wave laser light of picoseconds by gain-switching, the output beam may be amplified by the amplifying unit 140.

The laser generation and conversion system 100 includes optical fiber. The optical fiber forms the optical fiber loop 130. As the laser output continuously circulates the optical fiber loop 130 in one direction, repeatedly passing through the amplifying unit 140, the laser output is highly amplified. Compared to a structure in which a laser output of a seed laser is amplified by passing through one amplifier once in a linear high output laser system, amplification efficiency of the laser generation and conversion system 100 may be greatly increased. In addition, in a conventional bulk high output laser system, a laser light is partially lost since a plurality of lenses are coupled between a seed laser and an output amplifier. However, loss of the laser output does not occur in the laser generation and conversion system 100 according to the embodiment of the present invention since the optical fiber is included. Accordingly, high output power may be obtained efficiently.

The connection unit 120 is disposed between the oscillation unit 110 and the optical fiber loop 130. The connection unit 120 may be an optical circulator. In detail, a laser output generated by the oscillation unit 110 may be connected to a first port of the optical circulator, that is, the connection unit 120, using the connection unit 120 disposed between the oscillation unit 110 and the amplifying unit 140, and advances to optical fiber of a second port. The laser output is amplified at the amplifying unit 140 connected with the second port and advances to optical fiber of a third port. Part of the laser output is output through a connection unit, which is the output unit 160 connected with the third port while remaining laser output passes through the amplifying unit 140 through the optical fiber loop 130 again, thereby being repeatedly amplified. Thus, since amplification of the laser output is repeated in the laser generation and conversion system 100, high output pulsed wave laser may be obtained.

The laser generation and conversion system 100 may include an optical isolator 170 adapted to control the laser output advancing along the optical fiber loop 130 to flow in only one direction.

The amplifying unit 140 may include a pump laser diode 142 to provide a pumping light having a different wavelength from the output laser, an gain fiber 146 to amplify the laser output, and a wavelength division multiplexing (WDM) coupler 144 to connect the connection unit 120, the gain fiber 146, and the pump laser diode 142.

In detail, the amplifying unit 140 includes the pump laser diode 142, the WDM coupler 144 to connect the pump laser diode 142 with the optical fiber loop 130, and the gain fiber 146 to amplify the laser output. Operational principles of the foregoing parts will be described.

The laser light output from the pump laser diode 142 may input the pumping light through the WDM coupler 144 connected with the gain fiber 146 to which rare earth based elements are added. Population inversion of atoms occurs due to the pumping light. A laser light of a particular wavelength band is emitted according to kinds of the rare earth based elements. Therefore, the output is amplified. Here, it is preferred that the rare earth based elements emits a laser light of the same wavelength band as a wavelength of the laser output which is the seed laser of the oscillation unit 110. Although the laser output of the oscillation unit 110 has the same wavelength band as the laser light output from the gain fiber 146, the pump laser diode 142 has a different wavelength. Therefore, the WDM coupler 144 may be used.

FIG. 5 illustrates an operational mechanism of the amplifying unit 140 of the laser generation and conversion system 100 according to the first embodiment of the present invention. FIG. 5 shows an energy level at which population inversion of the gain fiber added with erbium which is the rare earth based element occurs. The amplifying unit 140 is operated by inputting the pumping light through the WDM coupler 144 to the gain fiber 146 added with erbium elements to a general silica fiber using the pump laser diode 142. An atom in a ground state rises to a highest level $^4I_{11/2}$ and quickly transits to a second level $^4I_{13/2}$, and atoms staying at the second level $^4I_{13/2}$ transit to a third level $^4I_{15/2}$, thereby emitting an amplified laser light having a wavelength of about 1.55 μm.

Part of the laser output through the connection unit which is the output unit 160 may be connected to a measuring device such as an oscilloscope through a powermeter or an optical spectrum analyzer (OSA) and a photodetector to analyze the laser output of the optical fiber loop 130. Therefore, the output power may be measured and characteristics of the laser output beam in a wavelength (λ)-domain and characteristics of the laser output beam in a time (t)-domain may be observed. Additionally, the high output pulsed wave may be converted to the high output continuous wave through connection to the continuous wave conversion unit 150. The output unit 160 may be configured to output the part of the laser output at a proper ratio such as 90:10 or 50:50 and such that input ports and output ports are provided by about 1×2 or 2×2 in number.

The high output pulsed wave laser output by the output unit 160 may be connected to the conversion unit 150 for conversion into the continuous wave. The conversion unit 150 may include a dispersion optical fiber 152. As passing through the dispersion optical fiber 152, the pulsed wave laser light may be converted into the continuous wave laser light by pulse dispersion according to which pulse of the pulsed wave is dispersed to several times by a dispersion amount of the dispersion optical fiber 152. Accordingly, the pulsed wave of the pulsed wave laser light may be converted to the continuous wave using a predetermined length of optical fiber having a large dispersion value. Here, the dispersion amount necessary to disperse the pulsed wave may be determined according to a repetition rate R of the pulsed wave and a spectral range S of an entire pulsed wave as follows.

$$D = \frac{5}{R \times S_{(2)}}$$

Therefore, the necessary dispersion amount may be obtained by the repetition rate R and the spectral range S of the high output pulsed wave laser light. An entire length of the optical fiber may be determined using the dispersion amount per kilometer (km) of the dispersion optical fiber. This may be used for the part for conversion into the continuous wave in the laser system. Thus, the pulsed wave may be simply converted into the continuous wave.

In FIG. 6, (a) illustrates the high output pulsed wave and (b) illustrates the high output continuous wave. A pulsed wave laser light is output from a high output pulsed wave fiber laser, the pulsed wave laser light by which laser output is performed repeatedly at a predetermined time period R, and passed through the predetermined length of the dispersion optical fiber. Therefore, a continuous wave laser light may be output, the continuous wave laser light by which laser output is continuously performed irrespective of a time interval.

The laser generation and conversion system 100 according to the first embodiment may be implemented in a simple structure and small size. Also, high stability, high reproducibility, and a high output laser output may be achieved. Furthermore, since conversion of the pulsed wave laser into the continuous wave laser is performed with ease, the high output pulsed wave laser and the high output continuous wave laser may be both obtained as necessary.

Hereinafter, a laser system according to second embodiments of the present invention will be described with reference to the drawings.

The laser system according to the second embodiment, that is, a two-wavelength output fiber laser system for generating electromagnetic waves may include an oscillation unit, a connection unit, an amplifying unit, a saturable absorber unit, a gain equalization unit, an output unit, and an optical isolator. The laser system may tune terahertz waves generated by controlling a gap between the two wavelengths, and obtain a high output through a fiber gain medium.

Figure 7:
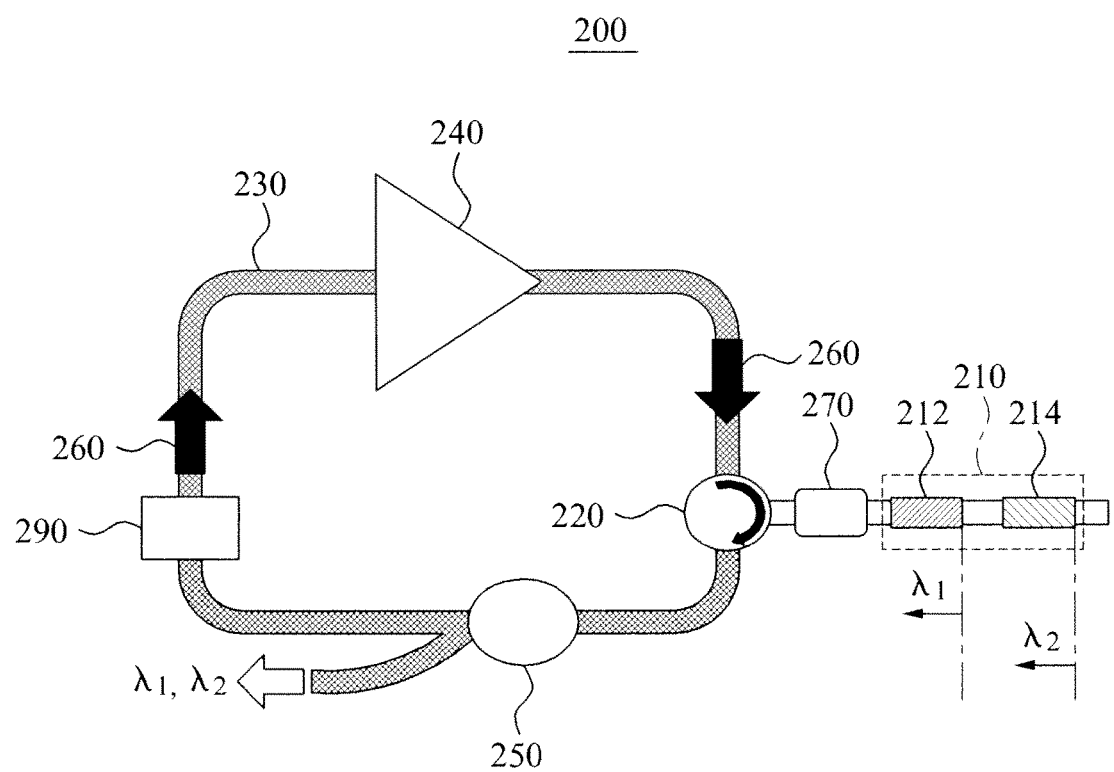
FIG. 7 is a diagram illustrating a two-wavelength output fiber laser system for generation of electromagnetic waves, according to a second embodiment of the present invention.
Figure 8:
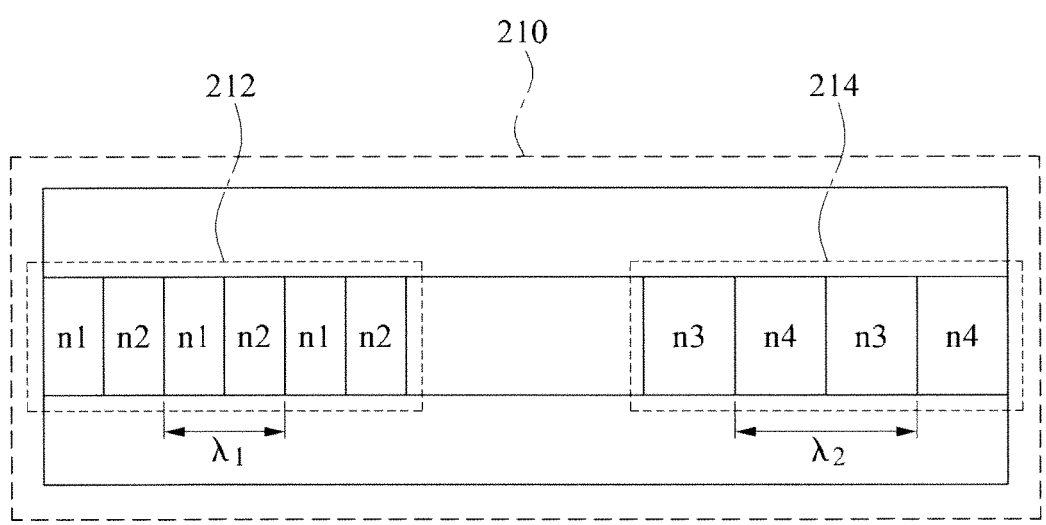
FIG. 8 is a diagram illustrating a configuration of an oscillator unit of a two-wavelength output fiber laser system for generation of electromagnetic waves, according to the second embodiment of the present invention.

FIG. 7 is a structure view of the two-wavelength output fiber laser system 200 for generating the electromagnetic waves. FIG. 8 is a structure view of an oscillation unit 210 of the two-wavelength output fiber laser system 200 according to the second embodiment.

Referring to FIG. 7, the laser system according to the second embodiment, that is, the two-wavelength output fiber laser system 200 may include an optical fiber loop 230 and include an oscillation unit 210, a connection unit 220, an amplifying unit 240, an output unit 250, an optical isolator 260 and a saturable absorber unit 270.

Referring to FIG. 8, the oscillation unit 210 may include a grating having two different Bragg wavelengths. The grating may include a first grating unit 212 disposed at a front of a slab waveguide and formed by periodical layers having refractive indexes n1 and n2, and a second grating unit 214 disposed at a rear of the slab waveguide and formed by periodical layers having refractive indexes n3 and n4. The grating may have different periods $\Lambda_1$ and $\Lambda_2$ to implement a laser which is an optical signal having two wavelengths. Also, the grating being a short period type has reflection peaks corresponding to the respective periods.

The grating may be manufactured by arranging a phase mask on the optical fiber and emitting UV rays so that a grating is generated in the optical fiber. In the grating, the oscillation wavelength $\lambda$ according to the periods may be determined by the period $\Lambda$ of the grating and an effective refractive index $n_{eff}$ of the optical fiber core.

Therefore, since the grating is configured to have different periods $\Lambda_1$ and $\Lambda_2$ or effective refractive indexes $n_{eff1}$ and $n_{eff2}$, the laser optical signal having two different wavelengths may be oscillated. The first grating unit 212 and the second grating unit 214 may be disposed at a predetermined distance.

Referring back to FIG. 7, the amplifying unit 240 has a particular gain band width, and performs amplification and oscillation when a signal corresponding to the particular band width is incident. The amplifying unit 240 may be an SOA, a Raman amplifier, or an amplifier added with rare earth based elements, and may have a gain band at a particular wavelength according to respective characteristics.

The Bragg grating of the oscillation unit 210 reflects a particular wavelength. Therefore, the Bragg grating may be used as an optical signal device for selecting a wavelength in the optical fiber laser system 200.

In the two-wavelength output fiber laser system 200 for generating electromagnetic waves, the connection unit 220 may be an optical circulator. When the wavelength reflected by the optical circulator is incident to the optical fiber loop 230 and advances, repeatedly passing through the amplifying unit 240, the optical signal having the corresponding wavelength may be oscillated.

The first grating unit 212 and the second grating unit 214 of the oscillation unit 210 may have different periods $\Lambda_1$ and $\Lambda_2$. When different wavelengths $\lambda_1$ and $\lambda_2$ are selected and passed through the optical fiber loop 230, the first and second grating units 212 and 214 output the laser light which is the optical signal through oscillation.

By the saturable absorber unit 270 disposed at a front end of the oscillation unit 210, the wavelength reflected from the oscillation unit 210 may form an oscillation wavelength with a narrow linewidth and a stable mode by a standing-wave saturation effect. Furthermore, since the saturable absorber unit 270 has linear double refraction and functions as a polarizer having saturation absorption more efficient to one polarizing axis of the optical fiber, the output laser light may have one stable polarization mode. That is, the saturable absorber unit 270 may absorb a frequency different from a frequency of a master oscillation wavelength.

The two-wavelength output fiber laser system 200 for generating electromagnetic waves controls the laser light to advance in one direction through the optical isolator 260. Part of the laser light may be output through a connection unit which is the output unit 250 and a remaining part of the laser light may be passed through the optical fiber loop 230 endlessly, thereby increasing the amplification efficiency.

The part of the laser light output through the connection unit which is the output unit 250 may be connected to a measuring device such as an oscilloscope through a power-meter or an OSA and a photodetector to analyze property of the laser output. Therefore, the output power of the laser light may be measured and characteristics of the laser output beam in a wavelength-domain and characteristics of the laser output beam in a time-domain may be observed.

The connection unit which is the output unit 250 may output the part of the laser light. Therefore, the output unit 250 may be configured to output the laser light at a ratio of about 90:10 to about 50:50 and to include input ports and output ports by 1×2 or 2×2 in number.

The two-wavelength output fiber laser is mixed with a photoconductive material, thereby determining a beat frequency according to the two oscillation wavelengths $\lambda_1$ and $\lambda_2$ and a wavelength spacing $\Delta\lambda$ by a following equation, and generates terahertz waves corresponding to the beat frequency:

$$\Delta f = \frac{c(\lambda_2 - \lambda_1)}{\lambda_1 \lambda_2} = \frac{c\Delta\lambda}{\lambda_2(\lambda_2 - \Delta\lambda)} = \frac{c\Delta\lambda}{\lambda_1(\lambda_1 + \Delta\lambda)}$$

The two-wavelength output fiber laser system 200 may further include a gain equalization unit 290.

The gain equalization unit 290 may be disposed on the optical fiber loop 230 to equalize gains of optical signals having two wavelengths and accordingly equalize powers of the two optical signals.

A nonlinear polarization rotator (NPR) may be used as the gain equalization unit 290. The NPR has a parallel structure of a polarization controller, an in-line polarizer, and a polarization controller. When a laser mode, which is an optical signal linearly polarized by the in-line polarizer, circulates a resonator and is received to the in-line polarizer again, the NPR controls the two polarization controllers to reduce a gain of a strong laser mode and increase a gain of a weak laser mode, thereby equalizing powers of the two laser modes. In the present embodiment, the NPR is illustrated as an example of the gain equalization unit 290. However, not limited thereto, other devices may be used for the gain equalization unit 290.

Hereinafter, a laser system according to a third embodiment of the present invention will be described.

Figure 9:
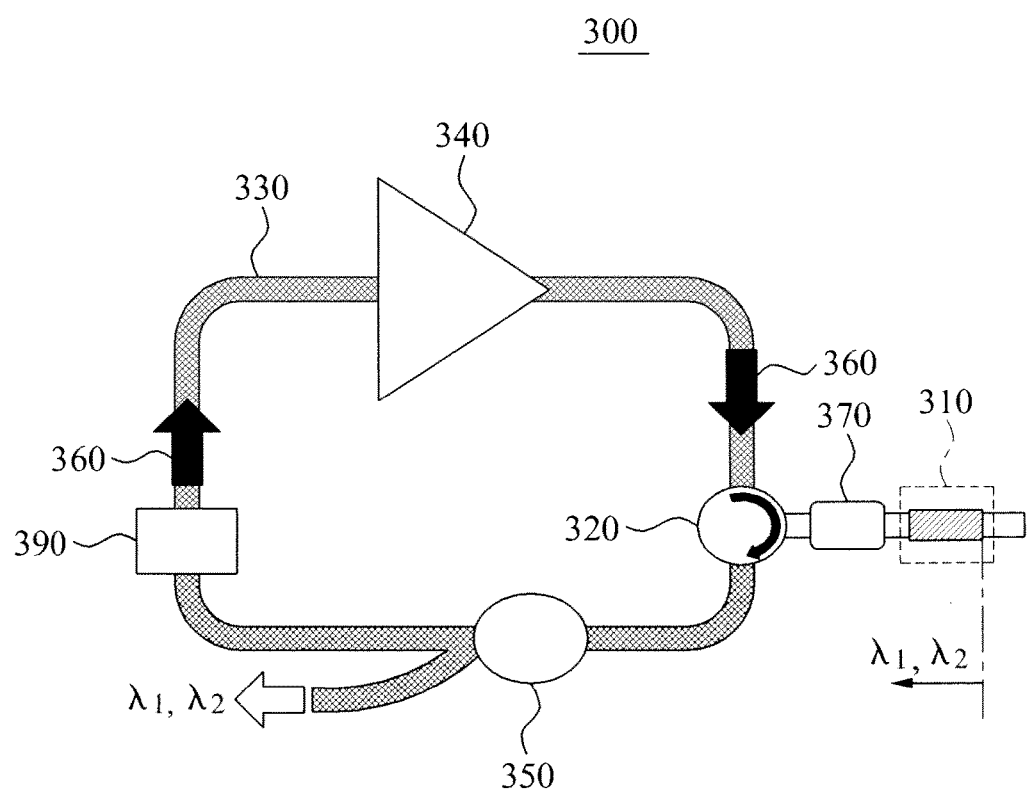
FIG. 9 is a diagram illustrating a configuration of a two-wavelength output fiber laser system for generation of electromagnetic waves, according to a third embodiment of the present invention.
Figure 10:
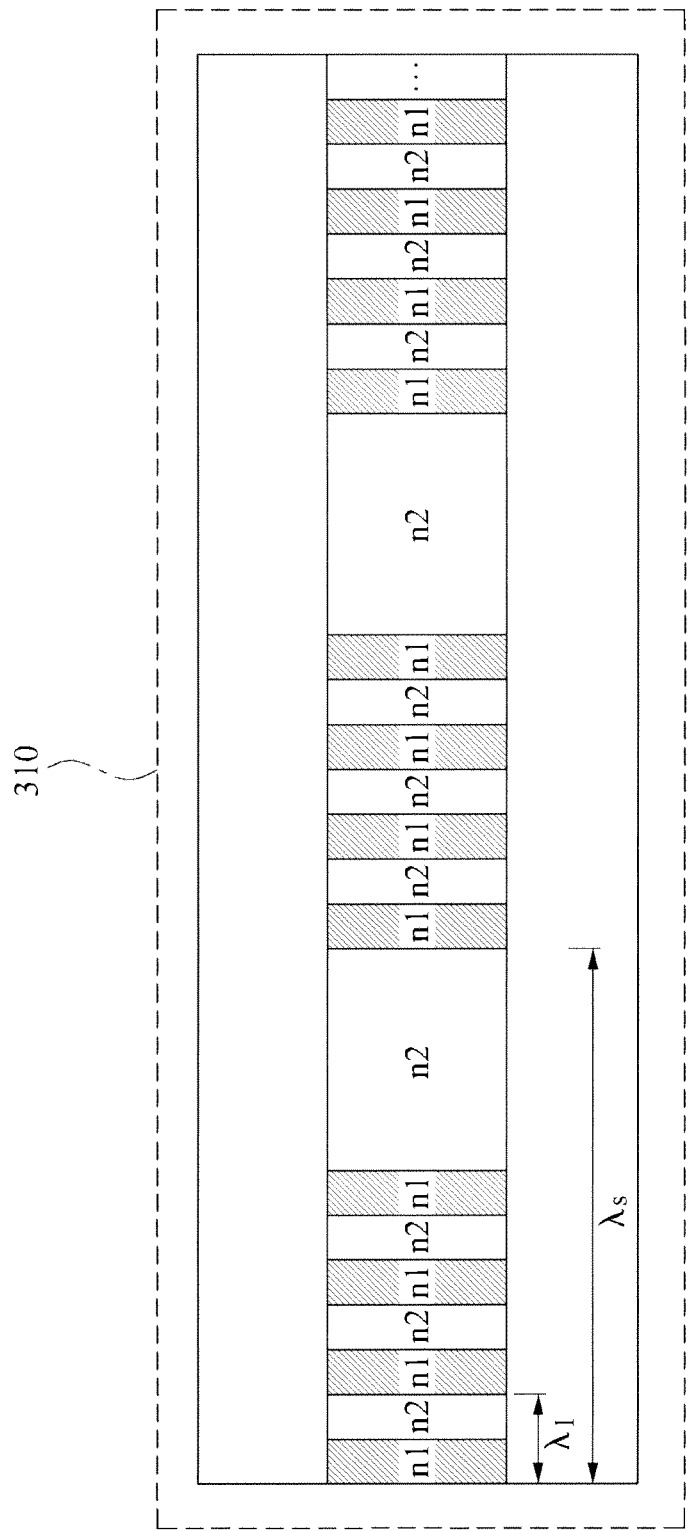
FIG. 10 is a diagram illustrating a configuration of an oscillator unit of the two-wavelength output fiber laser system according to the third embodiment of the present invention.

FIG. 9 is a diagram illustrating a configuration of a two-wavelength output fiber laser system 300 for generation of electromagnetic waves, according to a third embodiment of the present invention. FIG. 10 is a diagram illustrating a configuration of an oscillator unit 310 of the two-wavelength output fiber laser system 300 according to the third embodiment of the present invention.

The laser system according to the third embodiment, that is, the two-wavelength output fiber laser system 300 is structured in a similar manner to the two-wavelength output fiber laser system 200 for generating electromagnetic waves according to the second embodiment. Therefore, a description about the same or similar parts will be omitted for conciseness while only differences will be described in detail below.

Referring to FIG. 10, the oscillation unit 310 may include a sampled grating having a plurality of oscillation wavelengths. The grating may include a plurality of periodical layers having refractive indexes $n_1$ and $n_2$ of an optical fiber core. The grating may include the sampled grating, which is one of special gratings having reflection peaks at every predetermined channel interval. In the sampled grating, $\Lambda$ denotes a period of the Bragg grating and $\Lambda_s$ denotes a sampling period of the grating. The sampled grating may be manufactured by arranging a phase mask and an amplitude mask together and emitting UV rays so that the sampled grating is generated in the optical fiber core. In the grating, the wavelength spacing $\Delta\lambda$ of the sampled grating having the reflection peaks at every predetermined channel interval may be determined by the oscillation wavelength $\lambda$ of the grating, an effective refractive index $n_{eff}$ of the optical fiber core, and the sampling period $\Lambda_s$.

$$\Delta\lambda = \lambda^2/(2n_{eff}\Lambda_s)$$

Therefore, the sampled grating may have the reflection peaks at uniform intervals and may oscillate in two or more different wavelengths. Two wavelengths are preferred.

Referring to FIG. 9 again, the sampled grating of the two-wavelength output fiber laser system 300 for generating electromagnetic waves according to the third embodiment may have two different reflection wavelengths $\lambda_1$ and $\lambda_2$ so that two oscillation wavelengths are output. Hereinafter, a laser system according to a fourth embodiment of the present invention will be described.

Figure 11:
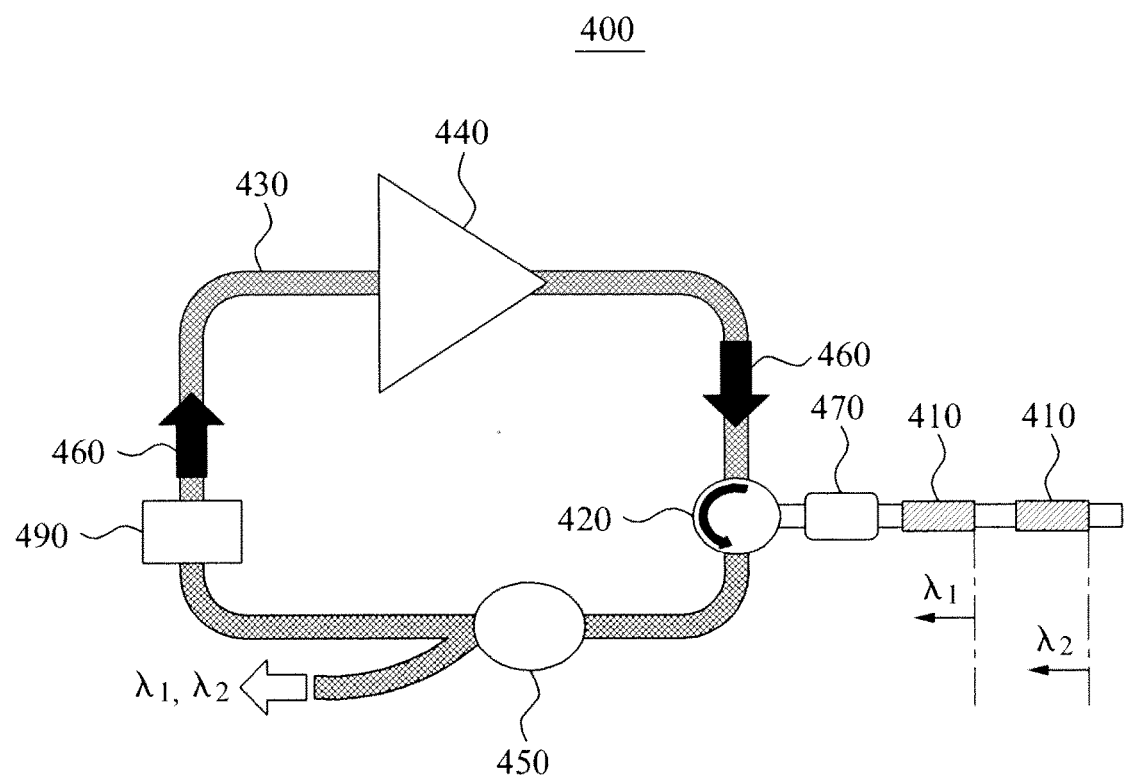
FIG. 11 is a diagram illustrating a configuration of a two-wavelength output fiber laser system for generation of electromagnetic waves, according to a fourth embodiment of the present invention.

FIG. 11 is a diagram illustrating a configuration of a two-wavelength output fiber laser system 400 for generation of electromagnetic waves, according to a fourth embodiment of the present invention.

Since the laser system 400 is structured similar to the two-wavelength output fiber laser system 200 according to the second embodiment, a description about the same or similar parts will be omitted for conciseness while only differences will be described below.

An oscillation unit 410 may include a semiconductor laser diode. In detail, two semiconductor laser diodes having difference oscillation wavelengths $\lambda_1$ and $\lambda_2$ may be included so that powers of two oscillation wavelengths are amplified and output.

Here, when an order of an optical circulator which is a connection unit 420 of the two-wavelength output fiber laser system 400 is changed, a laser light circulating an optical fiber loop 430 may be prevented from entering and damaging a semiconductor laser diode.

Hereinafter, a laser system according to a fifth embodiment of the present invention will be described.

Figure 12:
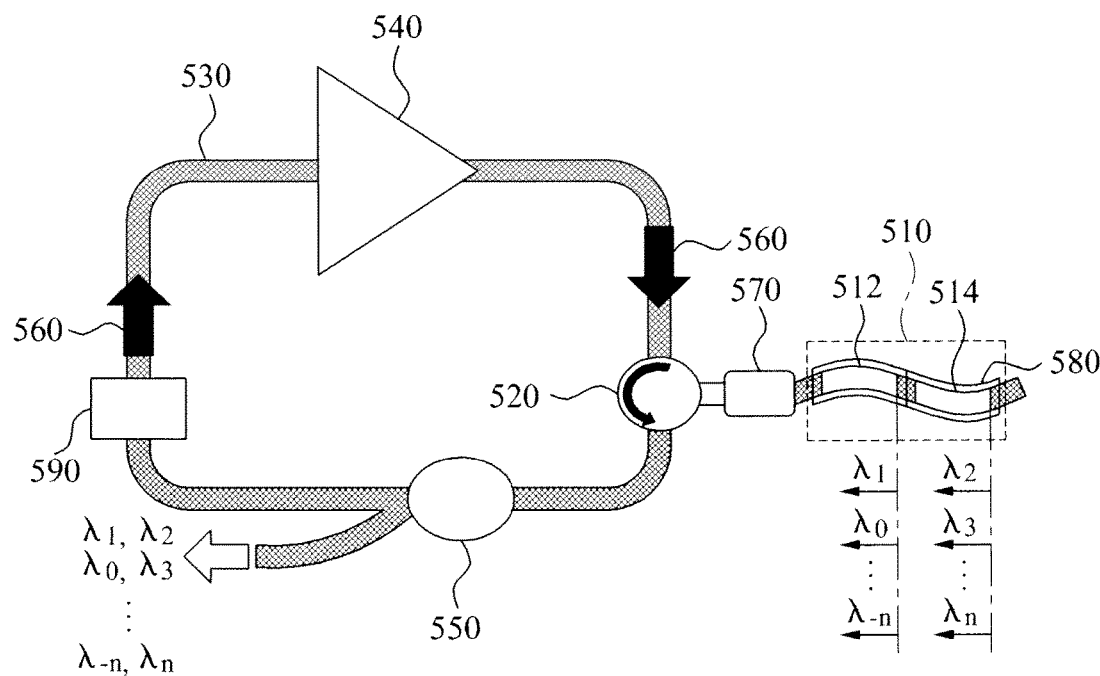
FIG. 12 is a diagram illustrating a configuration of a two-wavelength output fiber laser system for generation of electromagnetic waves, according to a fifth embodiment of the present invention.

FIG. 12 is a diagram illustrating a configuration of an oscillator of a two-wavelength output fiber laser system 500 for generation of electromagnetic waves, according to the fifth embodiment of the present invention.

Since the laser system 500 is structured similar to the two-wavelength output fiber laser system 200 according to the second embodiment, a description about the same or similar parts will be omitted for conciseness while only differences will be described below.

The two-wavelength output fiber laser system 500 according to the fifth embodiment may include an oscillation wavelength spacing control member to control a wavelength spacing. Through control of the wavelength spacing between two difference oscillation wavelengths $\lambda_1$ and $\lambda_2$, terahertz waves which denote electromagnetic waves mixed with a photoconductive material and output may be controlled.

Here, an optical fiber grating having the two different reflection wavelengths $\lambda_1$ and $\lambda_2$ may be shifted by applying a strain or changing temperature. The shifted reflection wavelength $\Box\lambda$ of the grating may be determined by an effective photoelastic constant Pe, an axial strain $\epsilon$, a thermal expansion coefficient $\alpha$, a thermo optic coefficient $\xi$, and the applied temperature change $\Box T$.

$$\Delta\lambda/\lambda = (1-P_e)\epsilon + (\alpha+\xi)\Delta T$$

Referring to FIG. 12, a strain may be applied by a strain control member 580, thereby moving two reflection wavelengths of gratings 512 and 514. A compression strain may be applied to the a first grating 512 of an oscillation unit 510 having the two different oscillation wavelengths $\lambda_1$ and $\lambda_2$ while a tension strain may be applied to a second grating 514 of the oscillation unit 510. Accordingly, out of reflection wavelengths of $\lambda_1$ and $\lambda_2$, a reflection wavelength $\lambda_1$ applied with the compression strain may be shifted to a short wavelength and another reflection wavelength $\lambda_2$ applied with the tension strain may be shifted to a long wavelength.

Therefore, the laser light output from the two-wavelength output fiber laser system 500 for generating electromagnetic waves may be tuned sequentially from $\lambda_1, \lambda_2$ to $\lambda_{n-1}$ and $\lambda_n$. Since beat frequencies are different according to the cases, terahertz waves generated by beating from a photoconductive material may be sequentially tuned.

Hereinafter, a laser system according to a sixth embodiment of the present invention will be described.

Figure 13:
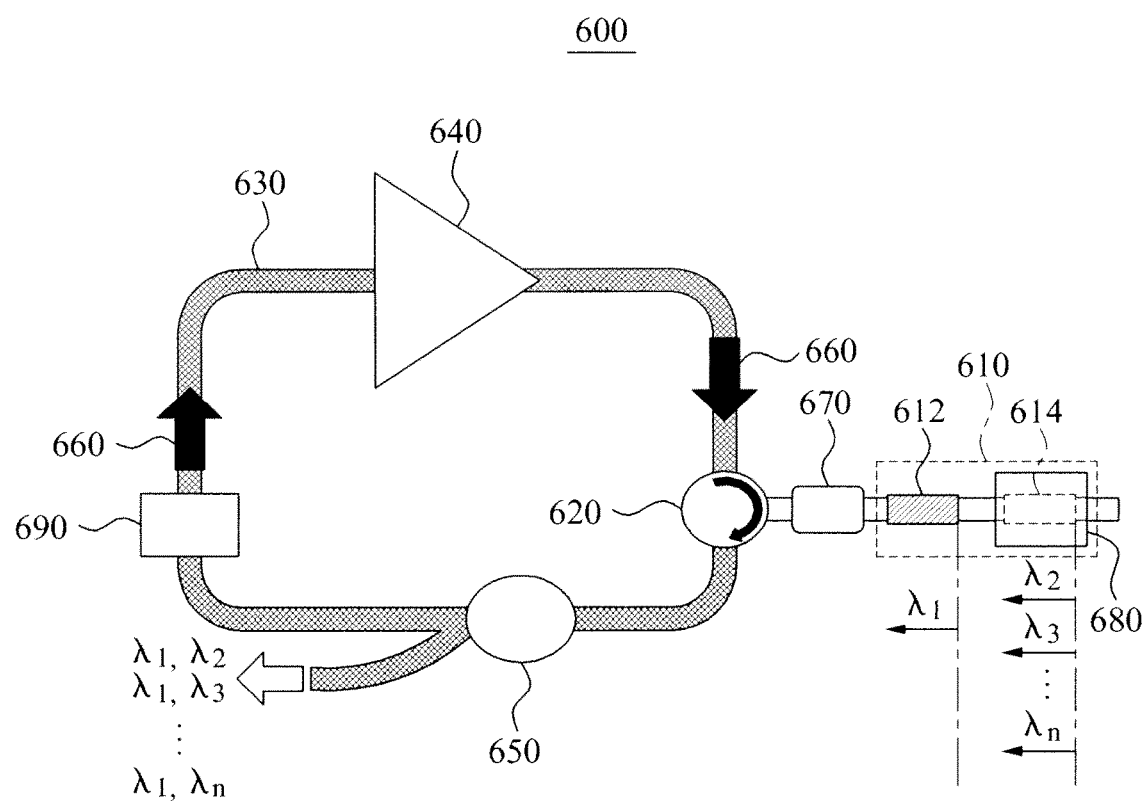
FIG. 13 is a diagram illustrating a configuration of a two-wavelength output fiber laser system for generation of electromagnetic waves, according to a sixth embodiment of the present invention.

FIG. 13 is a diagram illustrating a configuration of a two-wavelength output fiber laser system 600 for generation of electromagnetic waves, according to the sixth embodiment of the present invention.

A laser system according to the sixth embodiment, that is, the two-wavelength output fiber laser system 600 for generating electromagnetic waves is structured similar to the two-wavelength output fiber laser system 500 according to the fifth embodiment, a description about the same or similar parts will be omitted for conciseness while only differences will be described below.

Referring to FIG. 13, the two-wavelength output fiber laser system 600 according to the sixth embodiment may apply heat to control a wavelength spacing between two different reflection wavelengths $\lambda_1$ and $\lambda_2$.

When heat is applied to an optical fiber grating, reflection wavelengths are shifted in one direction by the optical fiber material. When heat is applied to a second grating unit 614 by a heater 680, a reflection wavelength $\lambda_2$ of the optical fiber grating may be shifted to a long wavelength. Accordingly, an output laser light may be tuned sequentially from $\lambda_1$, $\lambda_2$ to $\lambda_{n-1}$ and $\lambda_n$. In addition, since beat frequencies are different according to the cases, terahertz waves generated by beating from a photoconductive material may be sequentially tuned.

Hereinafter, a laser system according to a seventh embodiment of the present invention will be described.

Figure 14:
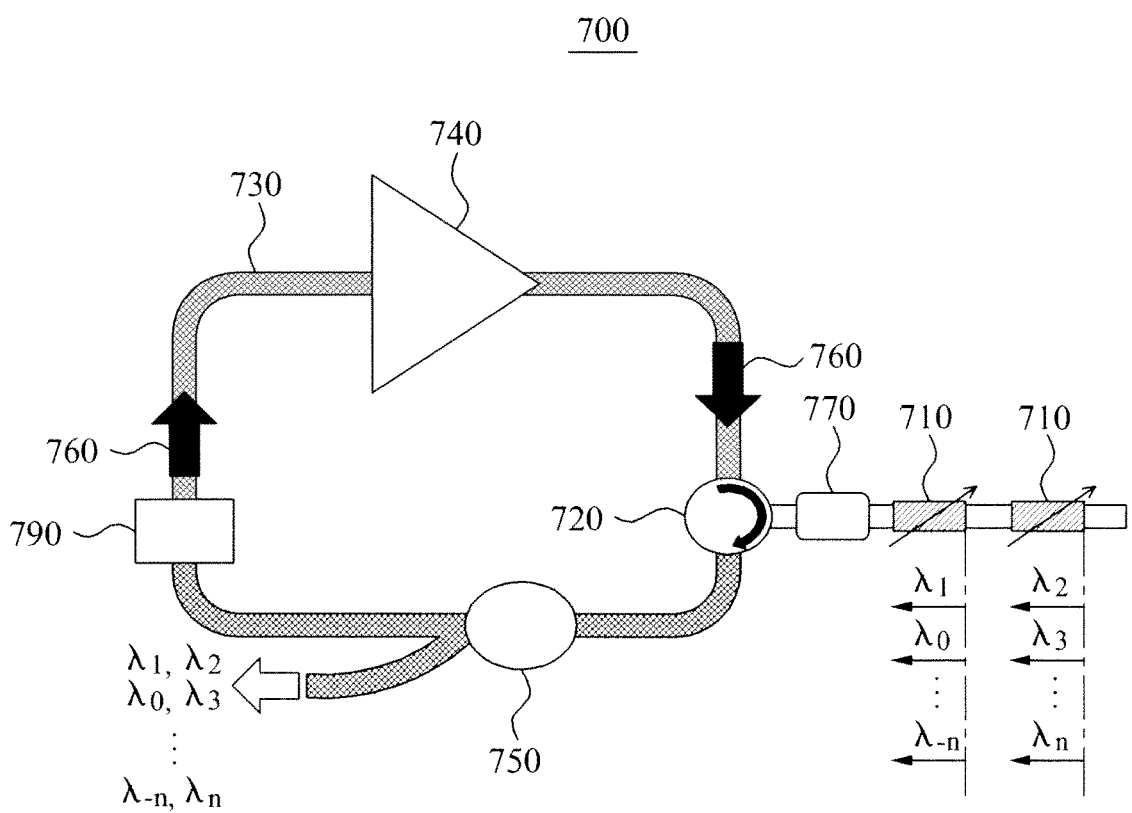
FIG. 14 is a diagram illustrating a configuration of a two-wavelength output fiber laser system for generation of electromagnetic waves, according to a seventh embodiment of the present invention.

FIG. 14 is a diagram illustrating a configuration of a two-wavelength output fiber laser system 700 for generation of electromagnetic waves, according to the seventh embodiment of the present invention.

A laser system according to the seventh embodiment, that is, the two-wavelength output fiber laser system 700 for generating electromagnetic waves is structured similar to the two-wavelength output fiber laser system 500 according to the fifth embodiment, a description about the same or similar parts will be omitted for conciseness while only differences will be described below.

Referring to FIG. 14, the two-wavelength output fiber laser system 700 according to the seventh embodiment may include two semiconductor laser diodes 710, as oscillation units 710, having different oscillation wavelengths $\lambda_1$ and $\lambda_2$. One of the oscillation wavelengths $\lambda_1$ may be shifted to a short wavelength while the other one of the oscillation wavelengths $\lambda_2$ is shifted to a long wavelength by controlling a driving current or voltage differently. Therefore, an output laser light may be tuned sequentially from $\lambda_1$, $\lambda_2$ to $\lambda_{n-1}$ and $\lambda_n$. In addition, since beat frequencies are different according to the cases, terahertz waves generated by beating from a photoconductive material may be sequentially tuned.

FIG. 15 is a diagram illustrating output spectrums of two-wavelength output fiber laser systems 200 and 300 for generation of electromagnetic waves. FIG. 15(a) illustrates a spectrum in a wavelength domain and FIG. 15(b) illustrates a spectrum in a frequency domain after passing through a photoconductive material.

Referring to FIGS. 15(a) and 15(b), part of a laser light output through the connection units which are the output units 250 and 350 of the laser systems 200 and 300 having the two different wavelengths $\lambda_1$ and $\lambda_2$ is observed by an OSA. Accordingly, a wavelength-domain spectrum having different wavelengths $\lambda_1$ and $\lambda_2$ may be obtained. After the laser light is incident to a photoconductive material and the output is observed through a radio frequency (RF) spectrum analyzer, a beat frequency $\Delta f$ of $\lambda_1$ and $\lambda_2$ may be obtained. Here, the reflection wavelengths of the oscillation units 210 and 310 may be configured such that the beat frequency $\Delta f$ is within a range from about 0.1 THz to about 10 THz.

In addition, the two-wavelength output fiber laser systems 500, 600, and 700 according to the fifth embodiment to the seventh embodiment may be configured to have a tuning range from about 0.1 THz to about 10 THz, by controlling the reflection wavelengths of the oscillation units 510, 610, and 710.

Hereinafter, a laser system according to an eighth embodiment of the present invention will be described. Substantially same parts as in the foregoing embodiments will not be described again.

Figure 16:
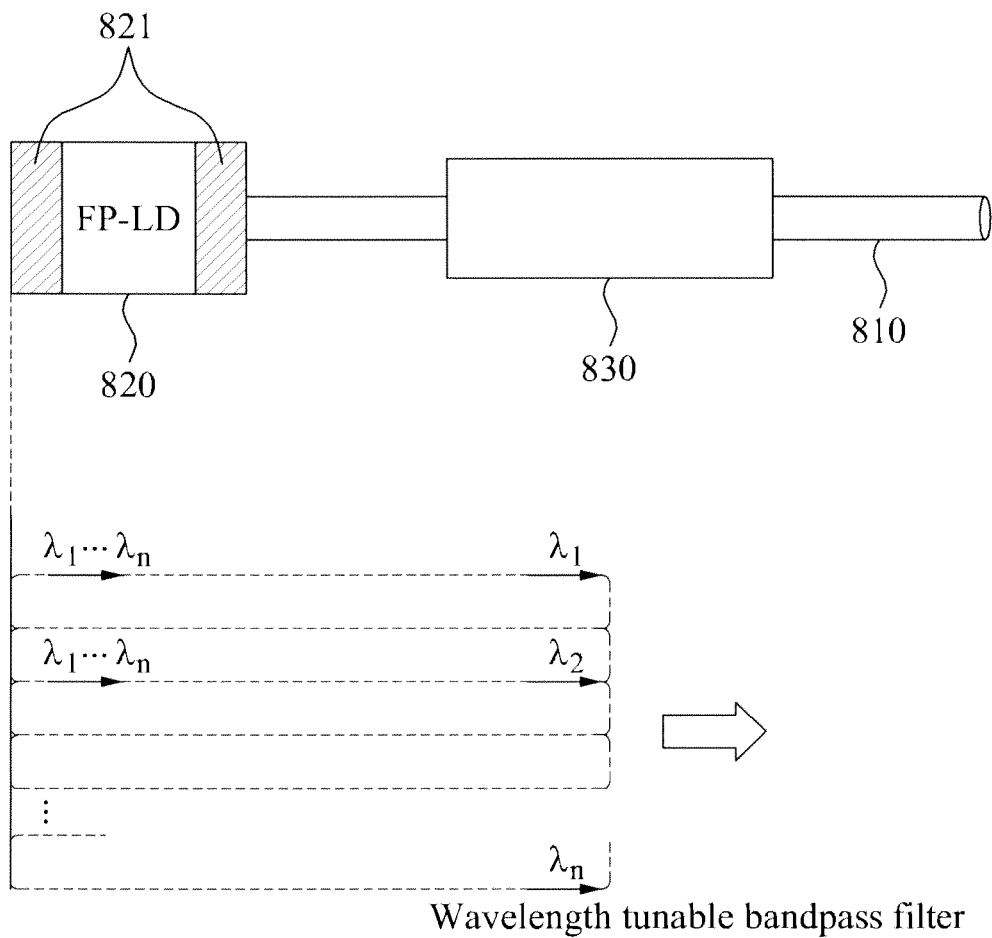
FIG. 16 is a diagram illustrating a partial structure of a wavelength tunable laser system according to an eighth embodiment of the present invention.

FIG. 16 illustrates a partial configuration of a wavelength tunable laser system 800 according to the eighth embodiment of the present invention.

As shown in FIG. 16, the laser system according to the eighth embodiment of the present invention, that is, a wavelength tunable laser system 800 may include an optical fiber 810, an oscillation unit 820 provided at one end of the optical fiber 810, that is, an FP laser diode 820 in the present embodiment, and a wavelength tuning optical filter 830.

The FP laser diode 820, as a light source, may include reflection surfaces 821 on both sides. Through such a structure, a plurality of longitudinal modes may be oscillated and output. The reflection surface 821 may be formed by coating a high reflection material. However, not limited thereto, one side for output between the both sides of the reflection surfaces 821 may be coated with an anti reflection material.

The wavelength tunable optical filter may include a piezoelectric material inside to tune a wavelength of a beam emitted from the FP laser diode 820. In addition, when a voltage applied to the piezoelectric material is changed, a pore distance of the wavelength tunable optical filter 830 is changed, and a window having a constant linewidth of a filter selected as an interference may perform filtering, moving in a wavelength region.

Here, the plurality of longitudinal modes oscillated and output from the FP laser diode 820 are matched with the window of the wavelength tunable optical filter 830. Therefore, one mode $\lambda_1$ of the plurality of longitudinal modes $\lambda_1$ to $\lambda_n$ is filtered and output. As the window of the wavelength tunable optical filter 830 is shifted, the one longitudinal mode matched with the plurality of longitudinal modes of the FP laser diode 820 may be sequentially output. Here, a tuning period of the wavelength tunable optical filter 830 may be corresponded to an interval between the longitudinal modes of the FP laser diode 820.

A linewidth of one longitudinal mode of the FP laser diode 820 and the linewidth of the window of the wavelength tunable optical filter 830 may correspond to each other although this is not limiting.

Hereinafter, a laser system according to a ninth embodiment of the present invention will be described. Substantially same parts as in the foregoing embodiments will not be described again.

Figure 17:
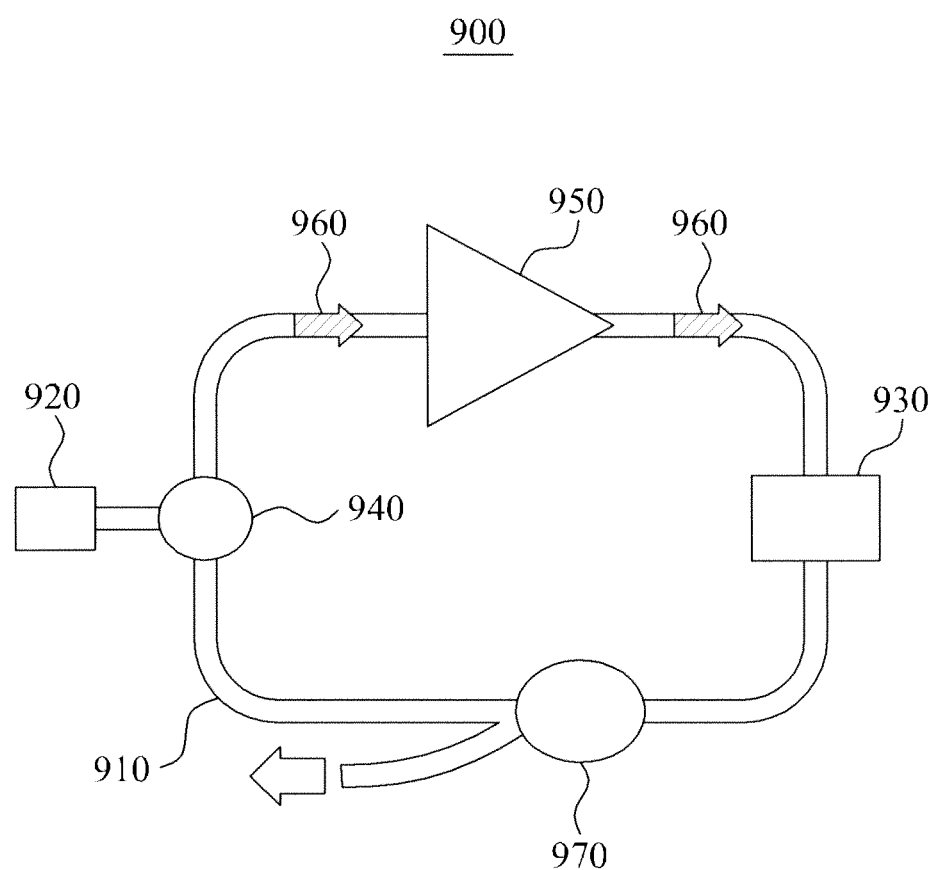
FIG. 17 is a diagram illustrating a partial structure of a wavelength tunable laser system according to a ninth embodiment of the present invention.

FIG. 17 illustrates a configuration of a wavelength tunable laser system 900 according to the ninth embodiment of the present invention.

Referring to FIG. 17, the laser system according to the ninth embodiment, that is, the wavelength tunable laser system 900 may include an optical fiber loop configured in a loop type to include an optical fiber 910, a connection unit 940, an oscillation unit 920 formed at one side port of the connection unit 940 to receive a beam into a resonator through the connection unit 940, that is, an FP laser diode 920 in the present embodiment, an amplifying unit 950, a wavelength tunable optical filter 930, two optical isolators 960, and an output unit 970 to output part of the beam to the outside.

The laser, that is, the beam output from the FP laser diode 920 of the present embodiment may be self-injected to the optical fiber 910 provided to the optical fiber loop through the connection unit 940. The connection unit 940 may have a proper ratio, for example 50:50, and a ratio of input ports and output ports of 1:2 or 2:2. The connection unit 940 may be an optical circulator so that the output beam provided from the FP laser diode 920 may be sequentially performed. However, this is not limiting.

The amplifying unit 950 may include a particular gain bandwidth and generate amplification and oscillation when a signal corresponding to the gain bandwidth is incident. The amplifying unit 950 may have a gain band enabling emission of laser of a same band as a wavelength band of an output laser of the FP laser diode 920.

The amplifying unit 950 may be an SOA, an amplifier added with rare earth based elements, or a Raman amplifier, and may have a gain band at a particular wavelength according to respective characteristics.

Therefore, the plurality of longitudinal modes generated by the FP laser diode 920 may be received into the resonator through the connection unit 940, and form a higher output gain band by being added up with the gain of the amplifying unit 950. The gain band may be filtered to a particular wavelength by the window having the constant linewidth, while passing through the wavelength tunable optical filter 930. The beam of the filtered wavelength may resonate and be emitted as laser.

The particular wavelength is one longitudinal mode having a narrow linewidth. The longitudinal mode is selected through matching with the plurality of longitudinal modes of the FP laser diode 920 injected from the outside of the resonator. Therefore, the output may be stable and the output power may be high.

The wavelength tunable optical filter 930 may vary a voltage being applied, thereby moving a window, and implement a wavelength-tuned fiber laser by filtering through sequential matching with the plurality of longitudinal modes of the FP laser diode 920.

The optical isolator 960 may be mounted on a path of the optical fiber 910 to be disposed before and after the amplifying unit 950. The optical isolator 960 controls the beam to advance in only one direction in the optical fiber loop. Therefore, the beam may be prevented from being reflected in a reverse direction from the optical fiber loop and being unnecessarily input to optical devices.

The output unit 970 may be configured to output part of the laser beam continuously circulating the optical fiber loop to analyze characteristics by a proper ratio, for example, about 90:10, 70:30, or 50:50. However, the examples are not limiting.

Figure 18:
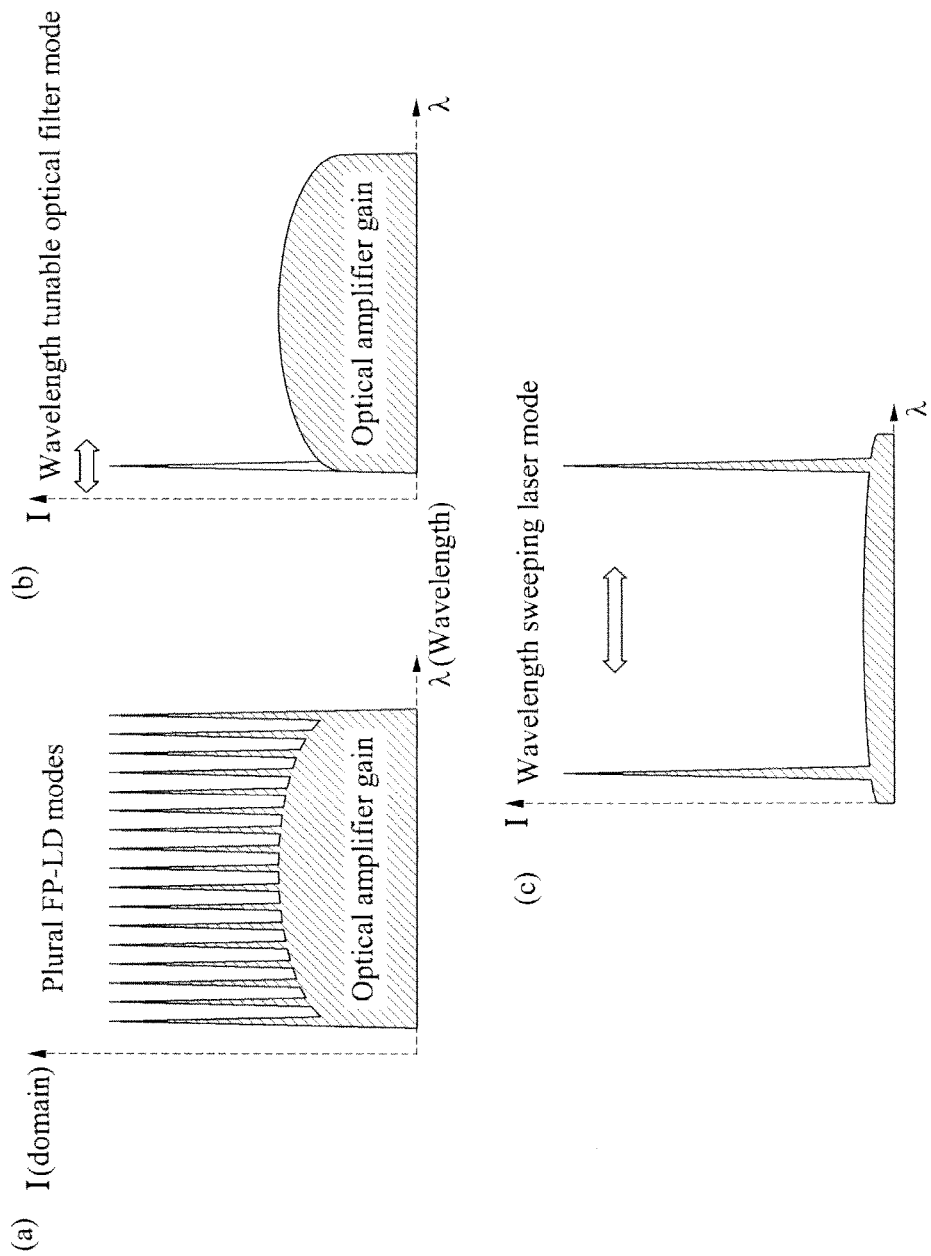
FIG. 18 are graphs illustrating an output at a wavelength-domain of the wavelength tunable laser system according to the ninth embodiment of the present invention.

FIG. 18 are graphs illustrating an output at a wavelength-domain of the wavelength tunable laser system according to the ninth embodiment of the present invention. FIG. 18(*a*) is a graph illustrating relations between a wavelength and a domain before the beam enters the wavelength tunable optical filter. FIG. 18(*b*) is a graph illustrating relations between a wavelength and a domain when the beam passes through the wavelength tunable optical filter. FIG. 18(*c*) is a graph illustrating a state in which the beam is resonated and oscillated.

Referring to FIG. 18(*a*), the beam of the plurality of longitudinal modes generated from the FP laser diode 920 is incident to the optical fiber loop, and an entire gain of the optical fiber loop is formed along with a gain of the amplifying unit 950.

Referring to FIG. 18(*b*), as the beam passes through the wavelength tunable optical filter 930, a longitudinal mode of the window having a constant linewidth is matched with one of the plurality of longitudinal modes of the FP laser diode 920. Accordingly, a single longitudinal mode is filtered.

Referring to FIG. 18(*c*), the beam is oscillated to laser by circulating the optical fiber loop. One of remaining longitudinal modes of the FP laser diode 920 and one mode-matched longitudinal mode are sequentially turned according to tuning of the wavelength tunable optical filter 930. Accordingly, the spectrum of the wavelength tunable laser output may be obtained.

Thus, according to the wavelength tunable laser system 900 according to the ninth embodiment, the plurality of longitudinal modes generated from the FP laser diode 920 may be high-mode matched with the wavelength tunable optical filter 930 by one longitudinal mode. Accordingly, stable laser output may be achieved. Additionally, by the longitudinal mode of the FP laser diode 920 having the narrow linewidth, a laser output having a single longitudinal mode may be obtained. Furthermore, a laser output power may be increased by an additional gain of the FP laser diode 920.

Hereinafter, a wavelength tunable laser system according to a tenth embodiment of the present invention will be described while omitting a description about substantially same parts as in the foregoing embodiments.

Figure 19:
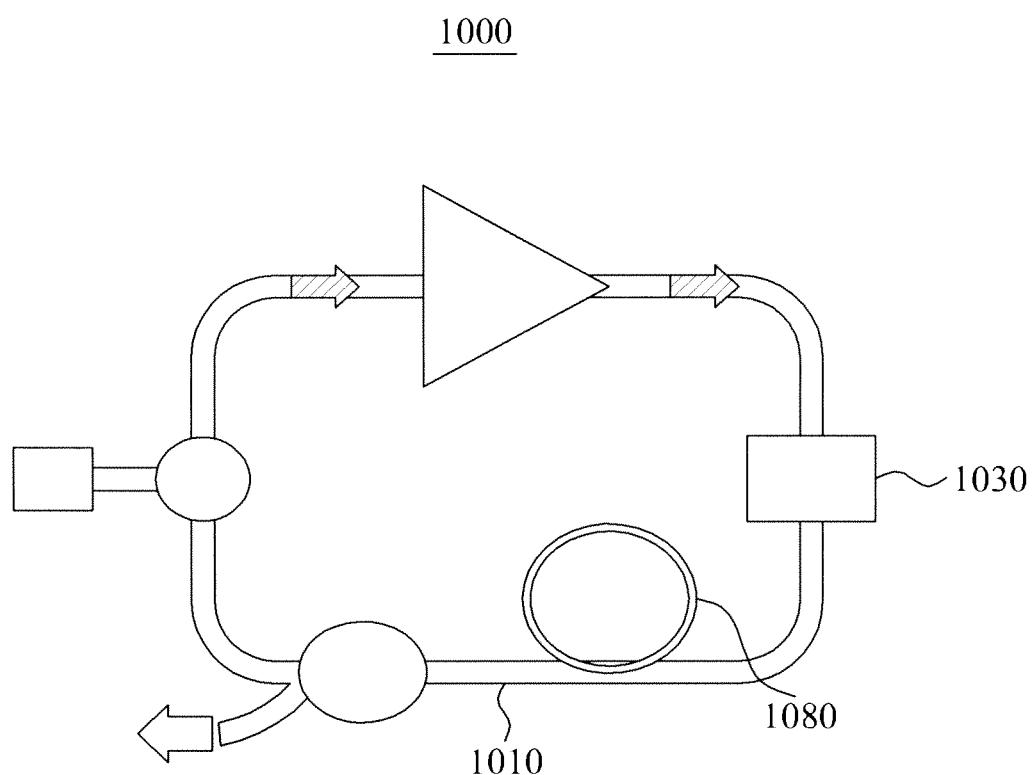
FIG. 19 is a diagram illustrating a configuration of a wavelength tunable laser system according to a tenth embodiment of the present invention.

FIG. 19 is a diagram illustrating a configuration of a wavelength tunable laser system 1000 according to the tenth embodiment of the present invention.

The laser system according to the tenth embodiment, that is, the wavelength tunable laser system 1000 is an optical fiber laser system 1000 capable of high speed wavelength tuning. As shown in FIG. 19, the laser system 1000 further includes a fiber delay line 1080 mounted on a path of an optical fiber 1010 besides the parts described in the foregoing embodiments.

The fiber delay line 1080 may control time for a beam to circulate a resonator. Since the fiber delay line 1080 synchronizes the circulation time of the beam with a tuning period of a wavelength tunable optical filter 1030, wavelength components being filtered may be passed through the wavelength tunable optical filter 1030 as same wavelength components after circulation. Therefore, the laser system 1000 capable of high speed wavelength tuning may be implemented.

Additionally, a length of a loop type resonator and a delay time of the beam in the resonator may be in relationship as shown in Equation 1 below.

$$\tau_{sweep} = \frac{l_{cavity}}{n \cdot v} \quad \text{(Equation 1)}$$

Here, n denotes a number of circulations of the beam through the optical fiber loop, $\tau_{sweep}$ denotes a circulation time of the beam through the optical fiber loop, $l_{cavity}$ denotes a length of the optical fiber 1010, and v denotes a beam speed in the optical fiber loop.

The time for the beam to circulate the optical fiber loop one time may be calculated using the length of the optical fiber loop and the beam speed in the optical fiber loop. When the wavelength tunable optical filter 1030 is tuned by setting the circulation time as the tuning period of the wavelength tunable optical filter 1030, the high speed wavelength tunable fiber laser system 1000 may be implemented.

The fiber delay line 1080 may include a general optical fiber provided as the optical fiber loop, that is, the general optical fiber, and a dispersion optical fiber that controls dispersion of the optical fiber loop. The circulation time of the optical fiber loop is a multiple of the tuning period of the wavelength tunable optical filter 1030.

Thus, according to the wavelength tunable laser system 1000 according to the tenth embodiment, a wavelength tuning speed may be increased by providing the fiber delay line 1080.

Although a few embodiments of the present invention have been shown and described, the present invention is not limited to the described embodiments. Instead, it would be appreciated by those skilled in the art that changes may be made to these embodiments without departing from the principles and spirit of the invention, the scope of which is defined by the claims and their equivalents.

The invention claimed is:

1. A laser system comprising:
an oscillation unit to generate a laser output;
a connection unit to connect the oscillation unit with an optical fiber loop;
an amplifying unit to amplify the laser output on the optical fiber loop;
a conversion unit disposed on a path of the optical fiber loop to convert pulsed wave laser output into continuous wave laser output; and
an output unit disposed between the connection unit and the conversion unit to split a part of the laser output toward the conversion unit,
wherein the laser output is repeatedly amplified by the amplifying unit while circulating the optical fiber loop,
wherein the output unit is a connection unit to split a part of the laser output,
the connection unit splits the laser output at a ratio of 90:10 to 50:50, and
a ratio of an input port and an output port is 1:2 or 2:2,
wherein the conversion unit comprises dispersion fiber having a high dispersion value,
the dispersion fiber generates pulse dispersion of continuous wave laser output, and
the dispersion fiber is connected to one end of the output unit to determine a dispersion amount according to a pulse repetition rate and an entire wavelength band.

2. The laser system of claim 1, wherein the oscillation unit is gain-switched to output a pulsed wave.

3. The laser system of claim 2, wherein the oscillation unit is a distributed feedback semiconductor laser diode of a single longitudinal mode or a Fabry-Pérot (FP) semiconductor laser diode of a single longitudinal mode, and the FP semiconductor laser diode implements laser of an external resonator structure by an optical fiber grating having a narrow linewidth for a laser output of a single longitudinal mode.

4. The laser system of claim 1, wherein
the connection unit is an optical circulator controlling the laser output from the oscillation unit to advance sequentially to a first port, a second port, and a third port,
the oscillation unit is connected to the first port,
the amplifying unit is connected to the second port,
and the third port is connected to the output unit.

5. The laser system of claim 1, wherein the amplifying unit comprises:
a pump laser diode to provide a pumping light having a different wavelength from the laser output;
an gain fiber to amplify the laser output; and
a wavelength division multiplexing (WDM) coupler to connect the connection unit, the gain fiber, and the pump laser diode,
wherein
the gain fiber comprises rare earth based elements,
the rare earth based elements emits a laser light having a same wavelength band as a wavelength of the laser output, and
the laser output is amplified by population inversion of atoms generated by the pumping light.

6. The laser system of claim 1, further comprising an optical isolator disposed on the optical fiber loop to control the laser output to progress in one direction.

7. A laser system comprising:
an oscillation unit to generate a plurality of wavelengths for generation of electromagnetic waves;
a connection unit to connect the oscillation unit and an optical fiber loop;
an amplifying unit to amplify an optical signal on the optical fiber loop;
a saturable absorber unit disposed between the oscillation unit and the connection unit to control a reflected wavelength of the oscillation unit to form a narrow linewidth and one oscillation wavelength in a stable mode;
an output unit disposed on the optical fiber loop to split a part of the optical signal; and
an optical isolator disposed on the optical fiber loop to control the output optical signal to progress in one direction,
wherein the optical signal is repeatedly amplified by the amplifying unit while circulating the optical fiber loop,
wherein the amplifying unit is an optical amplifier to which a semiconductor optical amplifier, a Raman optical amplifier, or rare earth based elements are added.

8. The laser system of claim 7, wherein the oscillation unit comprises:
two optic fiber Bragg gratings having different oscillation wavelengths or a sampled grating having two oscillation wavelengths; and
two semiconductor diodes having different oscillation wavelengths.

9. The laser system of claim 7, further comprising a gain equalization unit disposed on the optical fiber loop to equalize gains of a plurality of optical signals and accordingly equalize powers of the optical signals.

10. The laser system of claim 7, wherein the oscillation unit comprises an oscillation wavelength spacing control member to control an interval between two oscillation wavelengths,
wherein the oscillation wavelength spacing control member is a strain control member that applies tension or compression force to the oscillation unit to control a wavelength spacing by moving a wavelength toward a long wavelength by applying the tension and moving a wavelength toward a short wavelength by applying the compression force or a heater adapted to vary a temperature of the oscillation unit, the heater adapted to control the wavelength spacing by heating the oscillation unit so that the wavelength is shifted to a long wavelength or a short wavelength or a current or voltage control member adapted to control the wavelength spacing by controlling a current or a voltage so that the wavelength is shifted to a long wavelength or a short wavelength.

11. A laser system comprising:
an optical fiber;
an oscillation unit including a plurality of longitudinal modes and to transmit a beam to the optical fiber; and
a wavelength tunable optical filter mounted on the path of the optical fiber to filter a beam generated from the oscillation unit and passed through a connection unit by tuning the beam to a predetermined wavelength region; and a fiber delay line mounted on the path of the optical fiber to generate wavelength tuning of the beam at a high speed at the wavelength tunable optical filter,
wherein the fiber delay line includes a general optical fiber provided as the optical fiber loop and a dispersion optical fiber that controls dispersion of the optical fiber loop, and a circulation time of the optical fiber loop is a multiple of a tuning period of the wavelength tunable optical filter.

12. The laser system of claim 11, further comprising:
an amplifying unit mounted on the path of the optical fiber to amplify or oscillate the beam;
an output unit mounted on the path of the optical fiber to output a part of the beam passed through the wavelength tunable optical filter; and
at least one optical isolator mounted on the path of the optical fiber to control the beam to progress in one direction,
wherein the optical fiber is configured in a loop type for forming a path for a beam, the oscillation unit is provided at one side port of the connection unit mounted to the path of the optical fiber to receive the beam to the optical fiber.

13. The laser system of claim 12, wherein the oscillation unit is a Fabry-Pérot (FP) laser diode, of which both surfaces are coated with a high-reflection material or one surface for output out of the both surfaces is coated with an anti-reflection material, the wavelength tunable optical filter is a fiber FP type configured to continuously vary a wavelength by controlling an internal pore distance.

14. The laser system of claim 13, wherein
the connection unit sequentially outputs the beam provided from the FP laser diode,
the amplifying unit is any one selected from a semiconductor optical amplifier (SOA), a fiber amplifier including rare earth based elements, and a Raman amplifier,
a gain band of the amplifying unit corresponds to a wavelength band of the oscillation unit,
the connection unit and the optical isolator correspond to the wavelength band of the oscillation unit, and
the output unit outputs a part of the beam according to a predetermined ratio, the output unit of which a ratio of an input port and an output port is set to 1:2 or 2:2.

15. The laser system of claim 11,
wherein the plurality of longitudinal modes oscillated and output by the oscillation unit and a window of the wavelength tunable optical filter are matched so that one longitudinal mode is output.

16. The laser system of claim 15, wherein
the wavelength tunable optical filter comprises a piezoelectric material, and
the laser system varies a voltage applied to the piezoelectric material, thereby varying a pore distance provided to the wavelength tunable optical filter, and performs filtering when a window having a constant linewidth of the wavelength tunable optical filter selected as an interference is moved in the wavelength region.

* * * * *